US00RE38907E

(19) United States
(12) Reissued Patent
Matsudai et al.

(10) Patent Number: US RE38,907 E
(45) Date of Reissued Patent: Dec. 6, 2005

(54) SEMICONDUCTOR DEVICE

(75) Inventors: Tomoko Matsudai, Tokyo (JP); Tsutomu Kojima, Yokohama (JP); Akio Nakagawa, Fujisawa (JP)

(73) Assignee: Kabushiki Kaisha Toshiba, Kawasaki (JP)

(21) Appl. No.: 10/452,203

(22) Filed: Jun. 2, 2003

Related U.S. Patent Documents

Reissue of:
(64) Patent No.: 6,411,133
Issued: Jun. 25, 2002
Appl. No.: 09/606,090
Filed: Jun. 29, 2000

(30) Foreign Application Priority Data

Jun. 30, 1999 (JP) ..... 11-185860
Jun. 30, 1999 (JP) ..... 11-185863

(51) Int. Cl.[7] ..... H03K 5/22
(52) U.S. Cl. ..... 327/65; 327/77; 327/427; 327/66
(58) Field of Search ..... 327/52, 53, 65, 327/66, 77, 89, 108–112, 170, 427–434, 560–563; 330/253, 257, 261

(56) References Cited

U.S. PATENT DOCUMENTS

| | | | | |
|---|---|---|---|---|
| 4,893,090 A | * | 1/1990 | Boudewijns | 330/253 |
| 5,030,585 A | | 7/1991 | Gonzalez et al. | 438/210 |
| 5,242,844 A | * | 9/1993 | Hayashi | 438/151 |
| 5,422,593 A | * | 6/1995 | Fujihira | 327/427 |
| 5,446,418 A | * | 8/1995 | Hara et al. | 331/57 |
| 5,748,025 A | | 5/1998 | Ng et al. | 327/333 |
| 5,798,660 A | * | 8/1998 | Cheng | 327/65 |
| 6,002,290 A | | 12/1999 | Avery et al. | 327/52 |
| 6,124,741 A | | 9/2000 | Arcus | 327/112 |
| 6,177,818 B1 | | 1/2001 | Bertin et al. | 327/112 |

FOREIGN PATENT DOCUMENTS

| | | |
|---|---|---|
| JP | 6-204478 | 7/1994 |
| JP | 7-86601 | 3/1995 |
| JP | 8-316472 | 11/1996 |

OTHER PUBLICATIONS

W. Wondrak et al., "Poly–Silicone Logic For Integration of Drive, Sense and Protection Functions in Discrete Power Devices", Proceedings of 1998 International Symposium on Power Semiconductor Devices & Ics, Kyoto, Jun. 1998, pp. 371–374.

Tomoko Matsudai, et al., "Electrical Characteristics of Polysilicon CMOS Analog and Driver Circuits for Intelligent IGBTs", Extended Abstracts of the 1999 International Conference on Solid State Devices and Materials, Tokyo, Sep. 1999, pp. 94–95.

* cited by examiner

*Primary Examiner*—Long Nguyen
(74) *Attorney, Agent, or Firm*—Oblon, Spivak, McClelland, Maier & Neustadt, P.C.

(57) ABSTRACT

The differential amplifier of a comparator circuit includes first and second n-type MOSFETs for receiving an input signal, first and second p-type MOSFETs of a current mirror circuit, and a third n-type MOSFET of a current source circuit. The output stage includes a third p-type MOSFET for transmitting a signal, and a fourth n-type MOSFET of the current source circuit. The differential amplifier further includes fifth and sixth n-type MOSFETs respectively series-connected to the first and second n-type MOSFETs. The output stage further includes a seventh n-type MOSFET series-connected to the fourth n-type MOSFET. The gates of the fifth, sixth, and seventh n-type MOSFETs are connected to voltage bias circuits. The fifth, sixth, and seventh n-type MOSFETs suppress variations in voltage at an output node caused by poor saturation characteristics of the first, second, and fourth main n-type MOSFETs.

38 Claims, 15 Drawing Sheets

SEMICONDUCTOR DEVICE

Matter enclosed in heavy brackets [ ] appears in the original patent but forms no part of this reissue specification; matter printed in italics indicates the additions made by reissue.

CROSS-REFERENCE TO RELATED APPLICATIONS

This application is based upon and claims the benefit of priority from the prior Japanese Patent Applications No. 11-185860, Jun. 30, 1999; and No. 11-185863, Jun. 30, 1999, the entire contents of which are incorporated herein by reference.

BACKGROUND OF THE INVENTION

The present invention relates to a semiconductor device and, more particularly, to a semiconductor device using a poly-crystalline silicon (polysilicon) layer as an active region. More specifically, the first aspect of the present invention relates to a semiconductor device circuit for compensating for poor saturation characteristics of a field effect transistor having a MIS (Metal Insulator Semiconductor) structure (including a MOS (Metal Oxide Semiconductor) structure), i.e., MISFET, which are caused by using a polysilicon layer as an active region or by other causes. This circuit is used to improve the I/O (Input/Output) characteristics of a comparator circuit or logic gate circuit. The second aspect of the present invention relates to a semiconductor protection device for suppressing a current flowing through a main semiconductor switch to a set value or less and, more particularly, to a semiconductor protection device integrated on the same substrate as the main semiconductor switch in a power conversions system.

Prior arts concerning the first aspect will be described. As a technique of increasing the integration degree of a semiconductor device and forming a protection circuit on the same chip as a power device, a method of forming a polysilicon semiconductor layer via an insulating film on a single-crystalline silicon substrate layer for forming a power device, and forming a poly-crystalline MOSFET or the like using this semiconductor layer as an active region has been examined. This method can reduce the cost more greatly than a method of forming a device using single-crystalline SOI (Silicon On Insulator). In the present specification, a semiconductor device using a polysilicon layer as an active region will be called a polysilicon semiconductor device, e.g., polysilicon MOSFET, and a semiconductor device using a single-crystalline silicon layer as an active region will be called a single-crystalline silicon semiconductor device, e.g., single-crystalline silicon MOSFET.

By forming a polysilicon MOSFET on the same chip as a power device, the chip area and cost can be reduced. However, a polysilicon MOSFET, and particularly an n-type MOSFET are poorer in saturation characteristics than a single-crystalline silicon MOSFET. According to the studies made by the present inventors, a comparator circuit or logic gate circuit using polysilicon MOSFETs, which is constituted similarly to a circuit using single-crystalline silicon MOSFETs, is poor in I/O characteristics, and the I/O gain is low.

FIG. 1 is a graph showing the static characteristics of an n-type polysilicon MOSFET. FIG. 2 is a graph showing the static characteristics of a p-type polysilicon MOSFET. In a MOSFET with excellent saturation characteristics formed using a single-crystalline silicon layer as an active region, the drain current comes close to a constant current at a high drain voltage (several V or more). To the contrary, the static characteristics of the n-type polysilicon MOSFET are characteristics in which the drain current increases with the drain voltage, and hardly exhibits any saturation characteristics. The static characteristics of the p-type polysilicon MOSFET are characteristics in which the drain current comes close to a constant current at a drain voltage of 2 to 4 V. A MOSFET having poor saturation characteristics cannot be directly used as an actual device.

Prior arts concerning the second aspect will be described. To protect a main semiconductor switch such as an IGBT (Insulated Gate Bipolar Transistor) for controlling the load of a motor or the like from an overcurrent, a technique of using an IGBT with a sense terminal as a main semiconductor switch and constituting a protection circuit using the sense terminal has been proposed. The "IGBT with the sense terminal" is an IGBT with a sense terminal prepared by extracting part of an emitter unit and separating it from the emitter. In the IGBT with the sense terminal, the ratio of (emitter terminal current:sense terminal current)=the ratio of (the number of emitter units; the number of sense units) is set to a given value. For example, these ratios are set to flow a sense current of 10 mA at a rated current of 20 A. If the IGBT changes to an overcurrent state, the sense current also increases in accordance with this. Thus, the sense terminal can be used as an overcurrent sense terminal.

In resent years, an LSI (Large-Scale Integrated circuit) in which many transistors and resistors are arranged to constitute predetermined electrical circuits and are integrated on one chip has widely been used. A technique of integrating a vertical or horizontal high-breakdown-voltage device and its control circuit receives a great deal of attention because this technique can reduce the device area. For practical use, the cost must be reduced. For this purpose, a method of forming a poly-crystalline layer on a high-breakdown-voltage device via an oxide film or the like, and forming a CMOS (Complementary Metal Oxide Semiconductor) or bipolar transistor on the poly-crystalline layer has been examined. This method can reduce the cost larger than a method of forming a device using single-crystalline SOI (Silicon On Insulator).

Recently, high-quality polysilicon can be produced by annealing amorphous silicon, laser-annealing polysilicon, or extracting seed crystals from single-crystalline silicon to grow them. According to these techniques, an oxide film is formed on a silicon substrate, and a high-quality polysilicon film is formed on the oxide film to constitute a polysilicon SOI substrate which can replace a conventional SIO substrate.

However, a field effect transistor having a MOS structure, i.e., MOSFET using polysilicon as an active region exhibits unique characteristics such as a higher threshold, poorer saturation characteristics, and larger gate capacitance than those of a MOSFET using a single crystal as an active region. To integrate a high-breakdown-voltage output device and its control circuit, a circuit capable of giving protection using a device having these characteristics must be constituted. That is, a circuit for detecting an overcurrent and a circuit for giving protection within a short time after a load short-circuit state must be formed using a MOSFET having the above-described characteristics.

BRIEF SUMMARY OF THE INVENTION

It is an object of the present invention to provide a semiconductor device circuit for improving, by circuit design, poor saturation characteristics of a MISFET caused by using a polysilicon layer as an active region or by other causes. This realizes a circuit such as a comparator circuit or CMOS logic gate circuit equivalent to an ideal single-crystalline silicon circuit.

It is another object of the present invention to provide a semiconductor protection device for suppressing a current flowing through a main semiconductor switch to a set value or less and, more particularly, to a semiconductor protection device using polysilicon as an active region. In this case, it is still another object of the present invention to reduce the manufacturing cost of an integrated circuit on which the main semiconductor switch and semiconductor protection device as integrated.

According to a first object of the invention, there is provided a semiconductor device circuit comprising:

a sense circuit connecting a sense terminal, which flows a sense current branching from a current flowing through a path of the first and second main electrodes, and the control terminal of the switching element to each other, the sense circuit being configured to control the control terminal of the switching element based on the sense current to open the bypass, when the current flowing through the path of the first and second main electrodes exceeds the set value, thereby decreasing a voltage applied from the control power supply to the main control electrode.

Additional objects and advantages of the invention will be set forth in the description which follows, and in part will be obvious from the description, or may be learned by practice of the invention. The objects and advantages of the invention may be realized and obtained by means of the instrumetalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

a second n-type MISFET which is connected between the node and the first MISFET and uses a semiconductor layer as an active region, the second MISFET being configured to suppress variations in voltage at the node caused by the poor saturation characteristic of the first MISFET; and a circuit portion configured to apply a bias voltage to a gate of the second MISFET.

Figure 1:
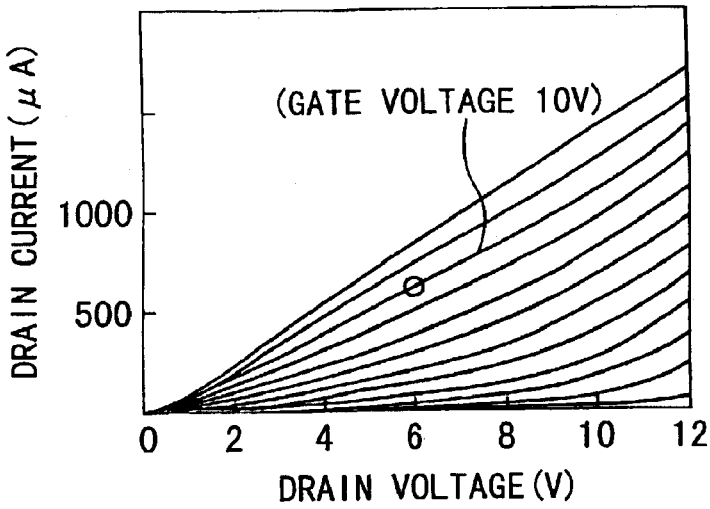
FIG. 1 is a graph showing the static characteristics of an n-type polysilicon MOSFET.
Figure 2:
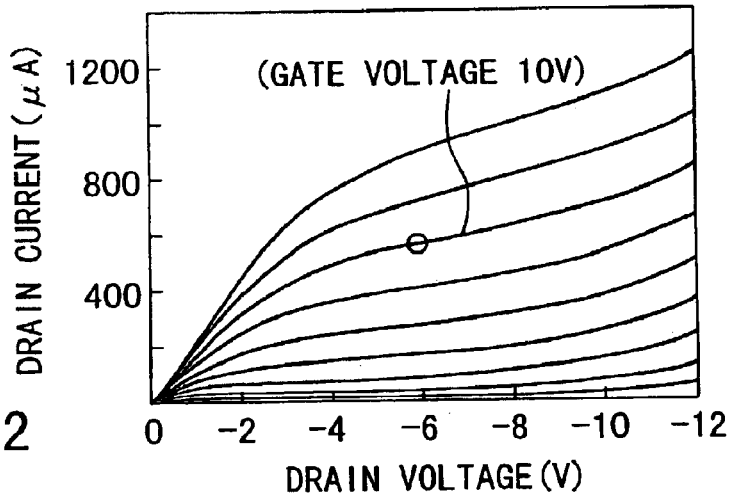
FIG. 2 is a graph showing the static does not saturate with an increase in drain voltage within an operating range.
Figure 3:
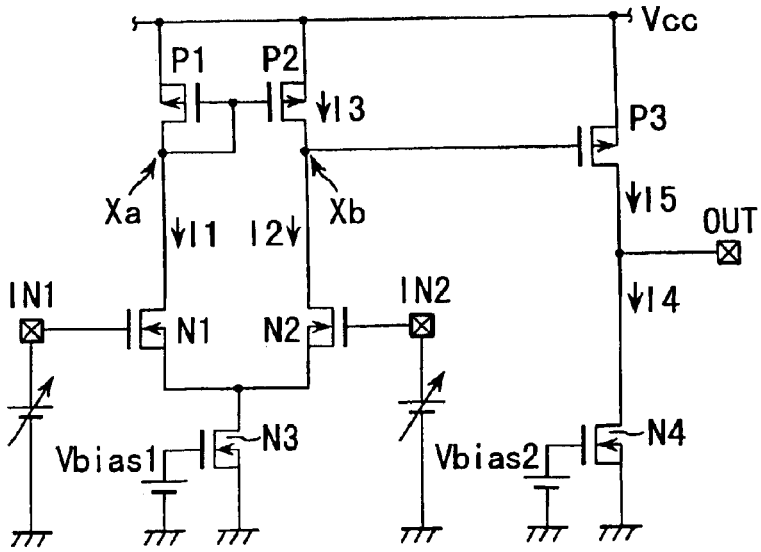
FIG. 3 BACKGROUND ART
Figure 4:
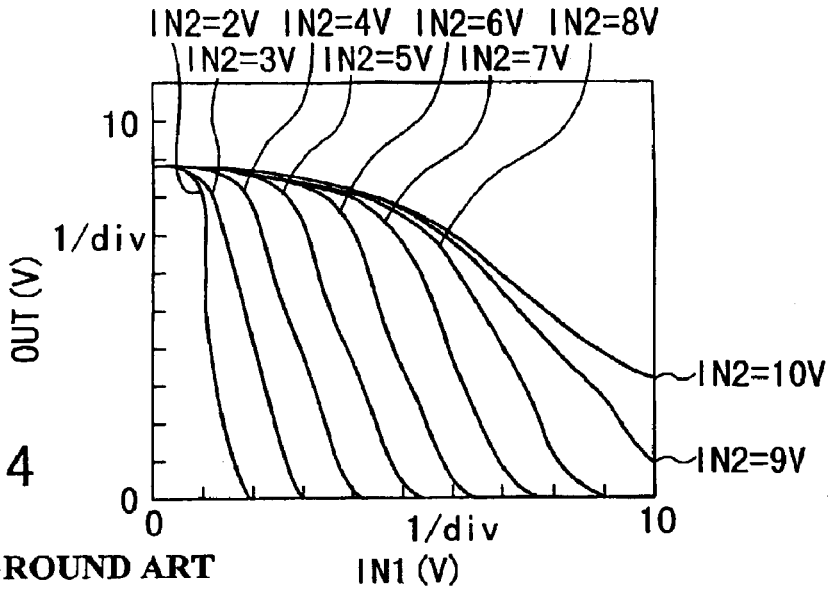
FIG. 4 BACKGROUND ART
Figure 5:
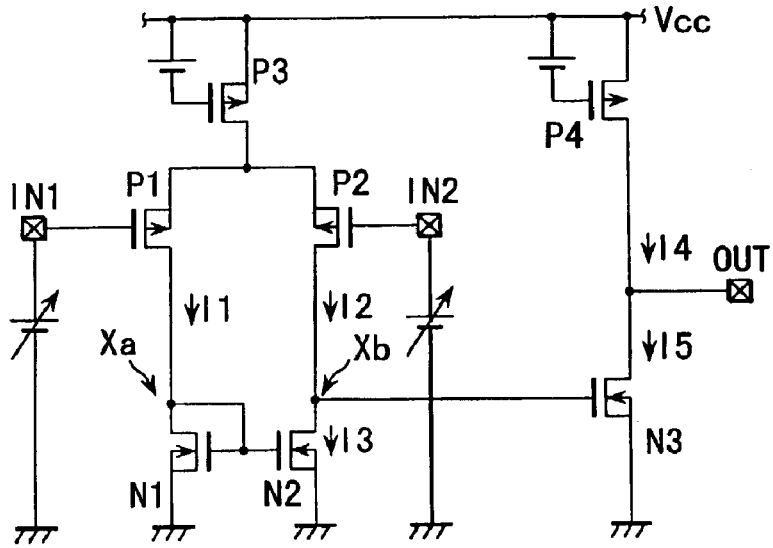
FIG. 5 BACKGROUND ART
Figure 6:
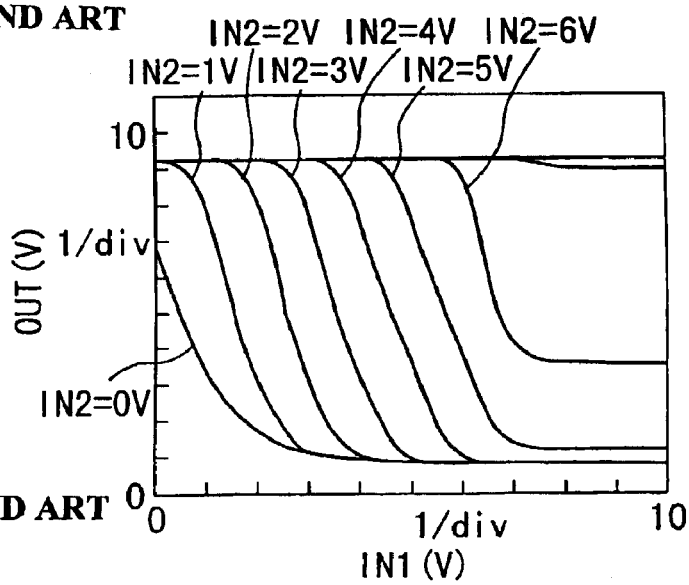
FIG. 6 BACKGROUND ART
Figure 7:
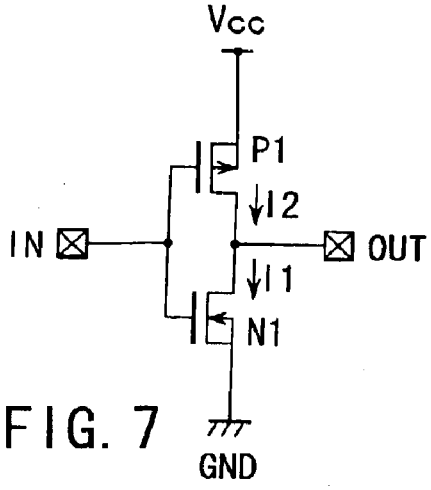
FIG. 7 BACKGROUND ART
Figure 9:
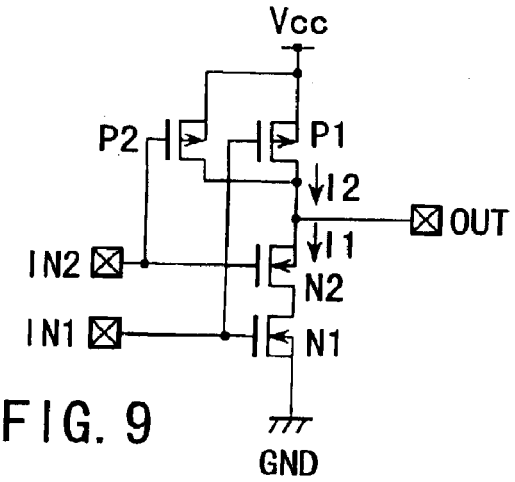
Figure 8:
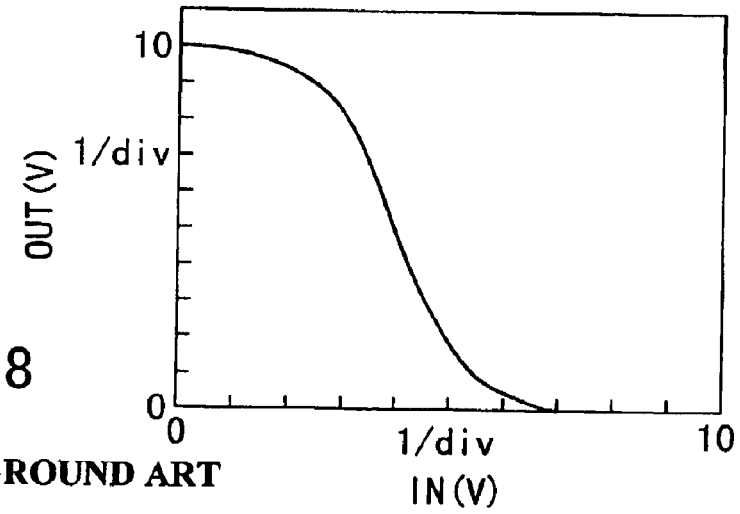
FIG. 8 BACKGROUND ART
Figure 10:
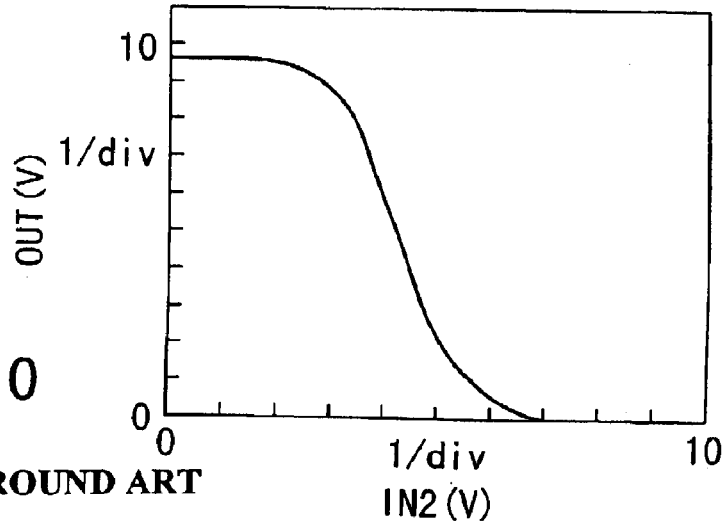
FIG. 10 BACKGROUND ART
Figure 11:
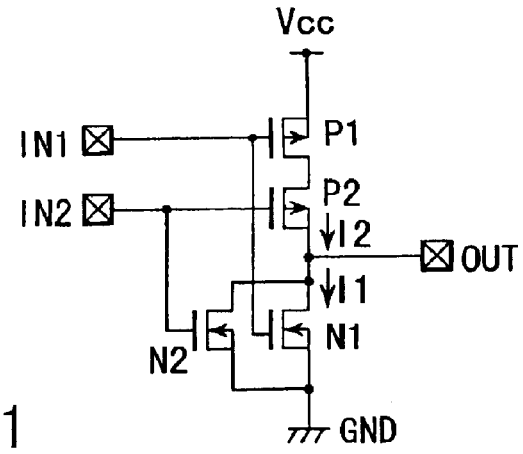
FIG. 11 BACKGROUND ART
Figure 12:
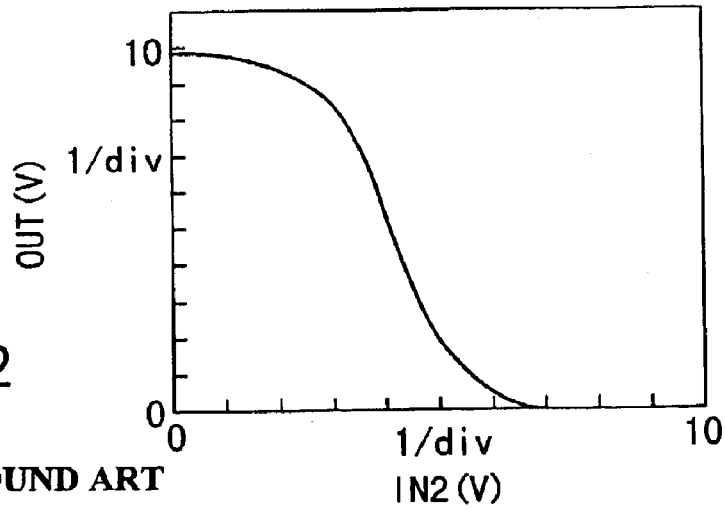
FIG. 12 BACKGROUND ART
Figure 13:
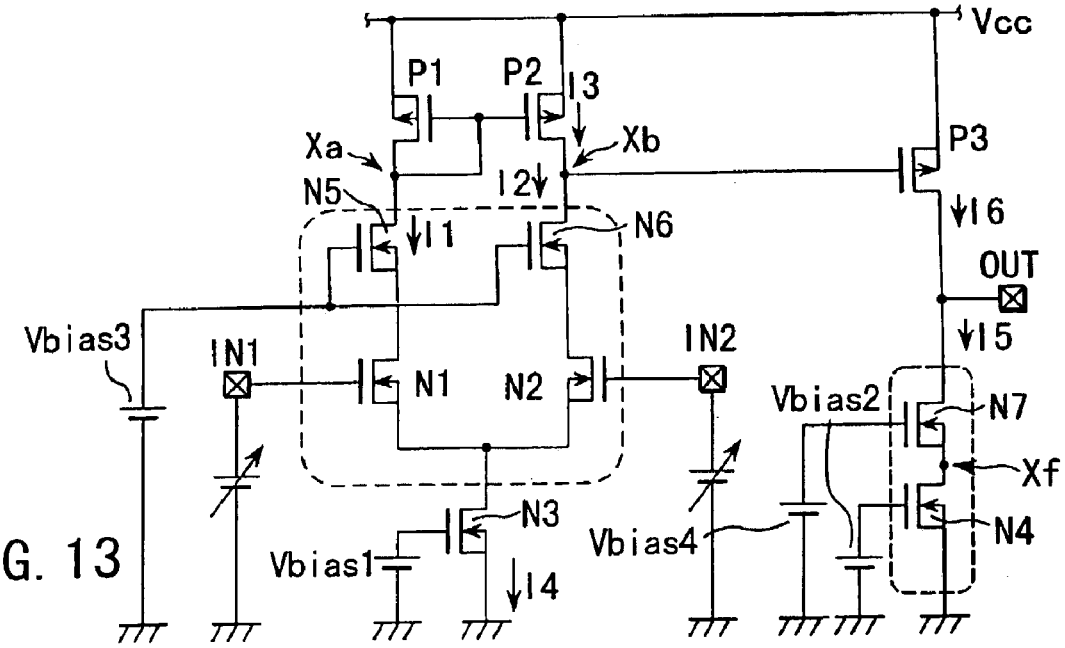
Figure 14:
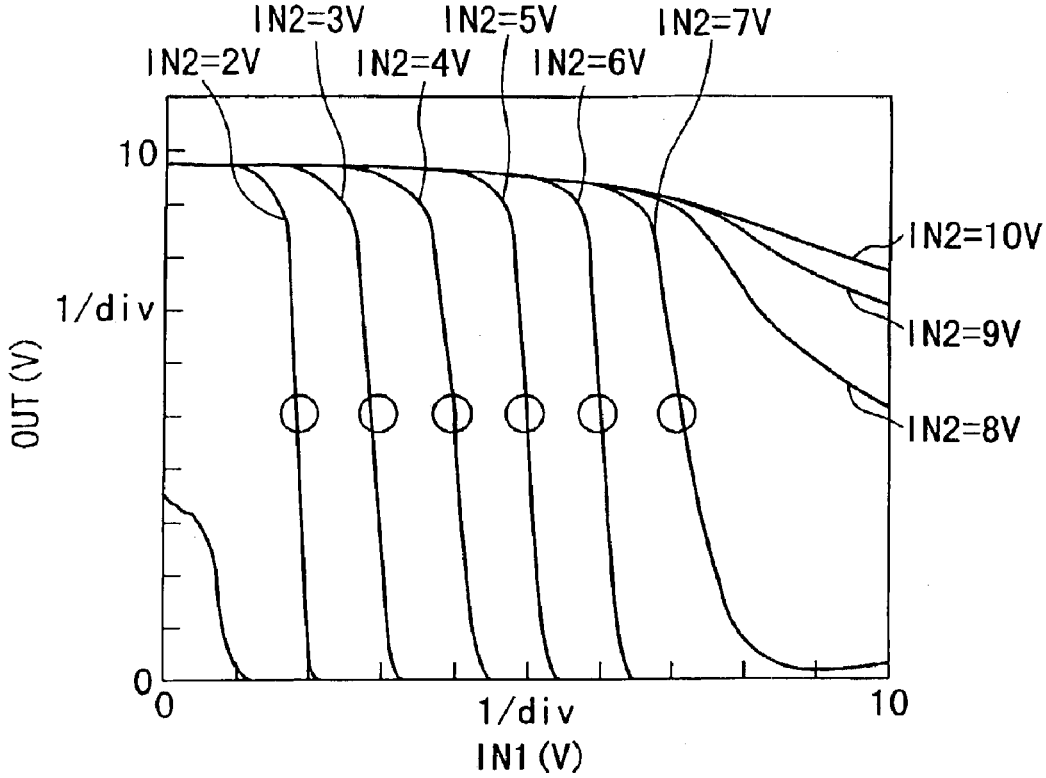
Figure 15:
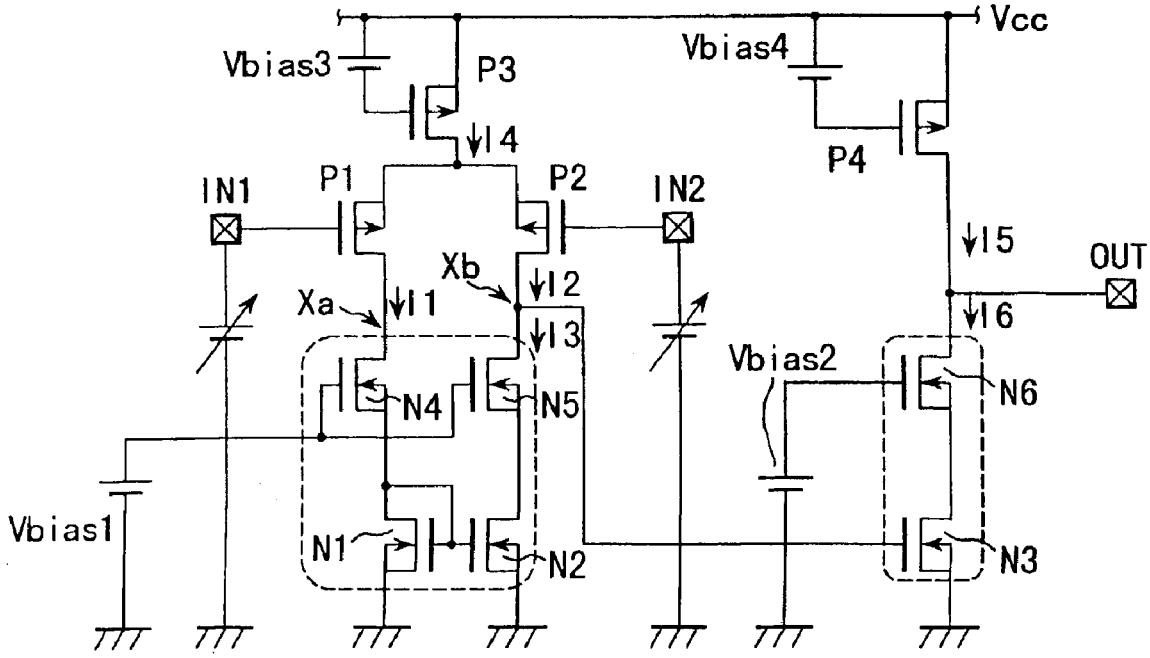
Figure 16:
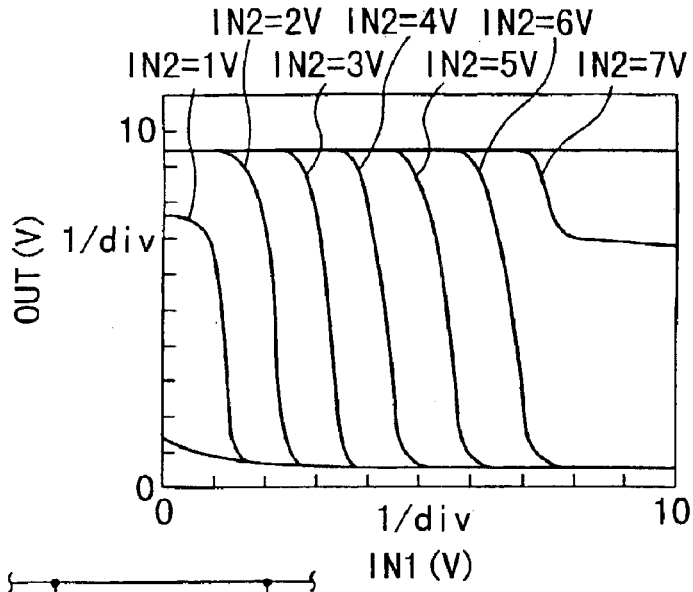
Figure 17:
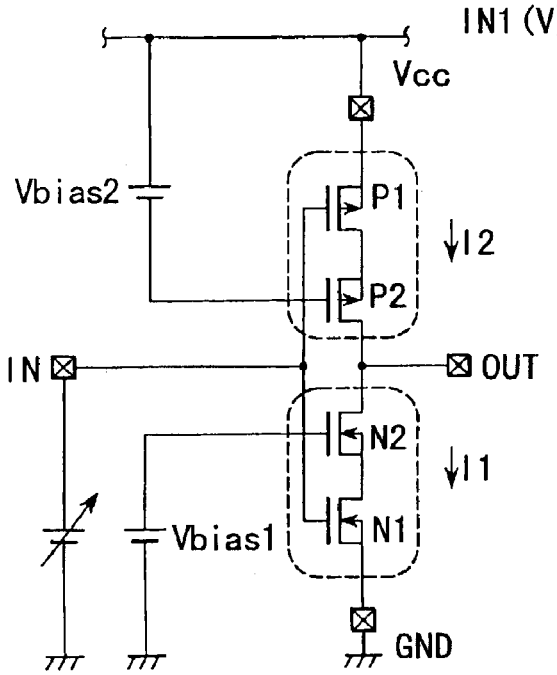
Figure 18:
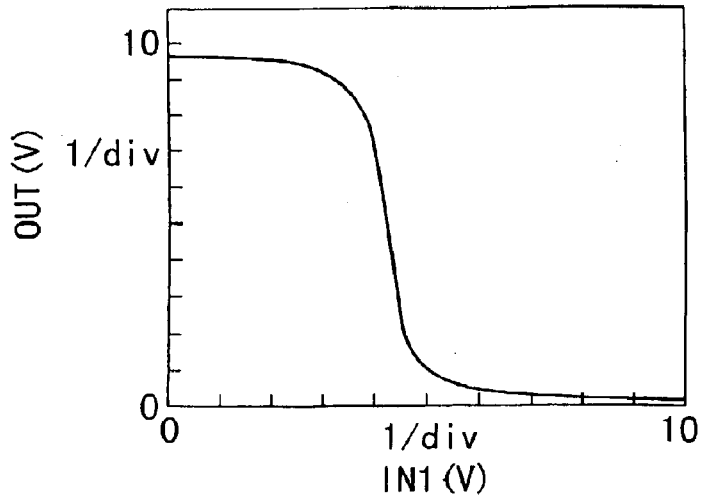
Figure 19:
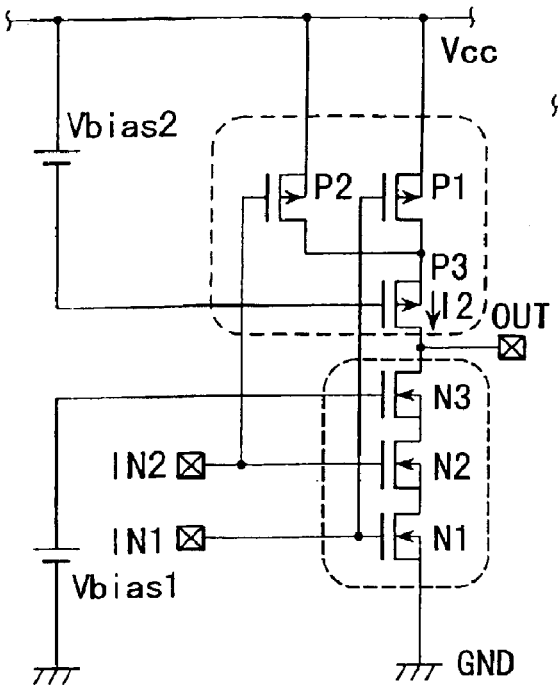
Figure 21:
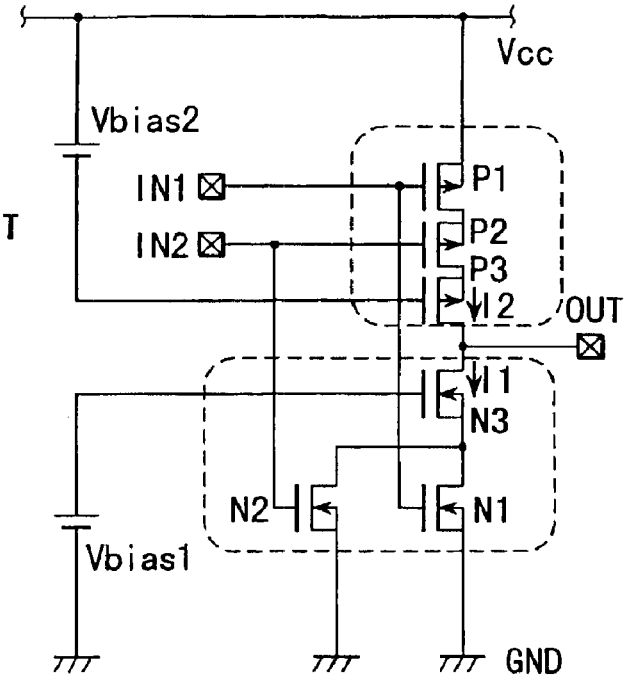
Figure 20:
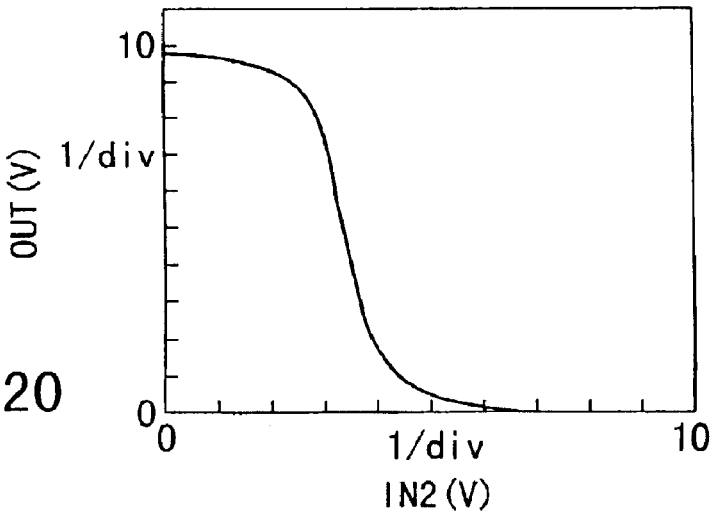
Figure 22:
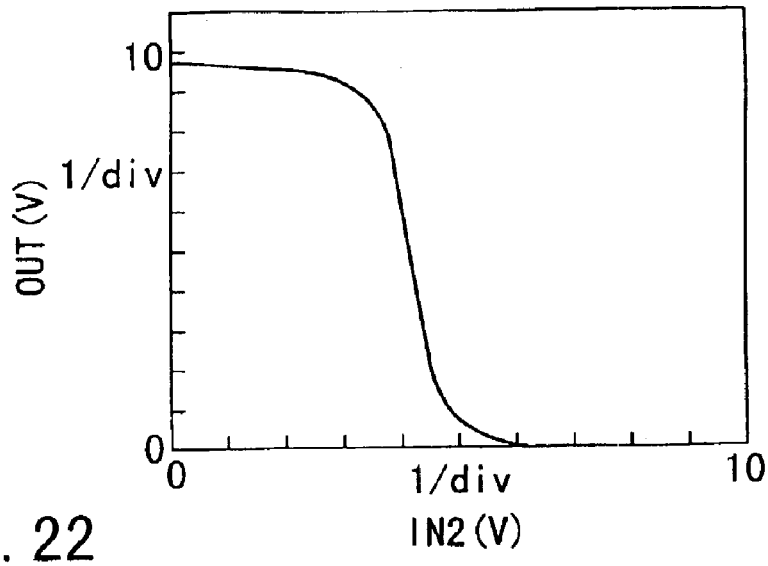
Figure 23:
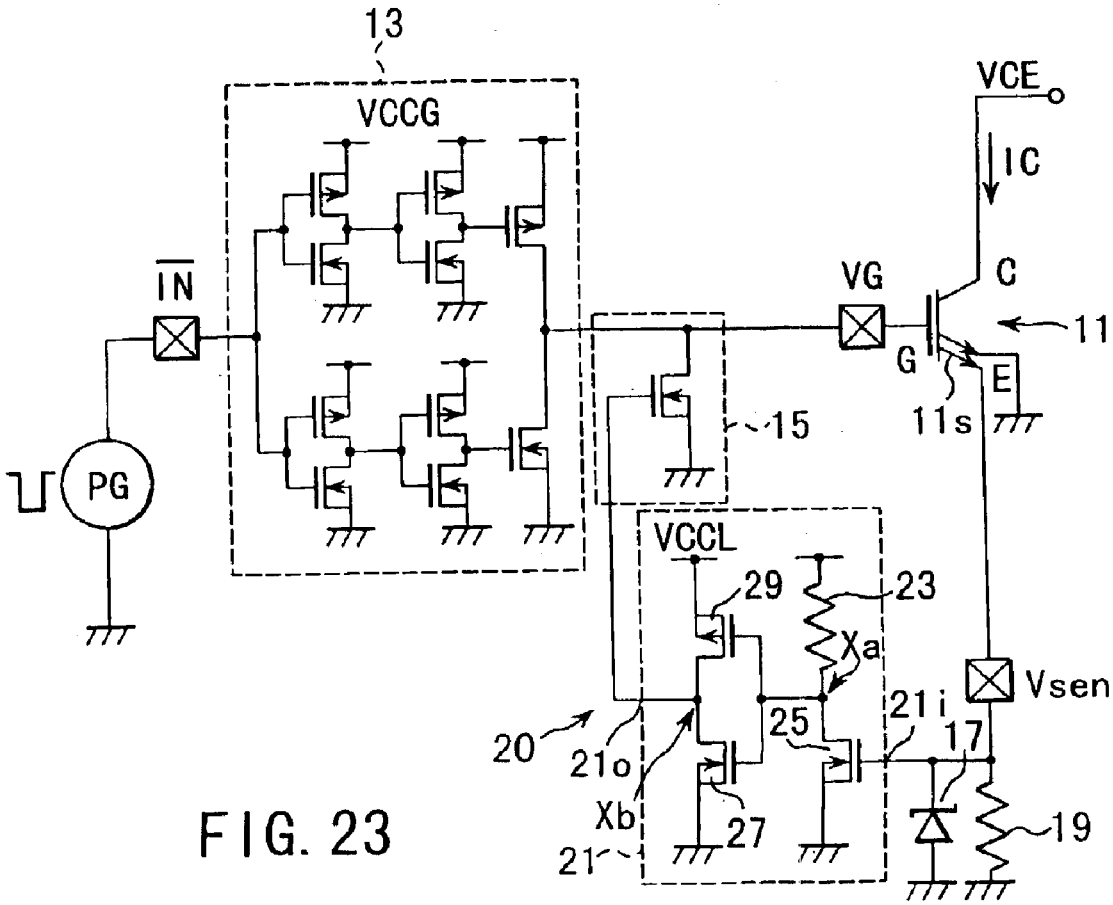
Figure 24:
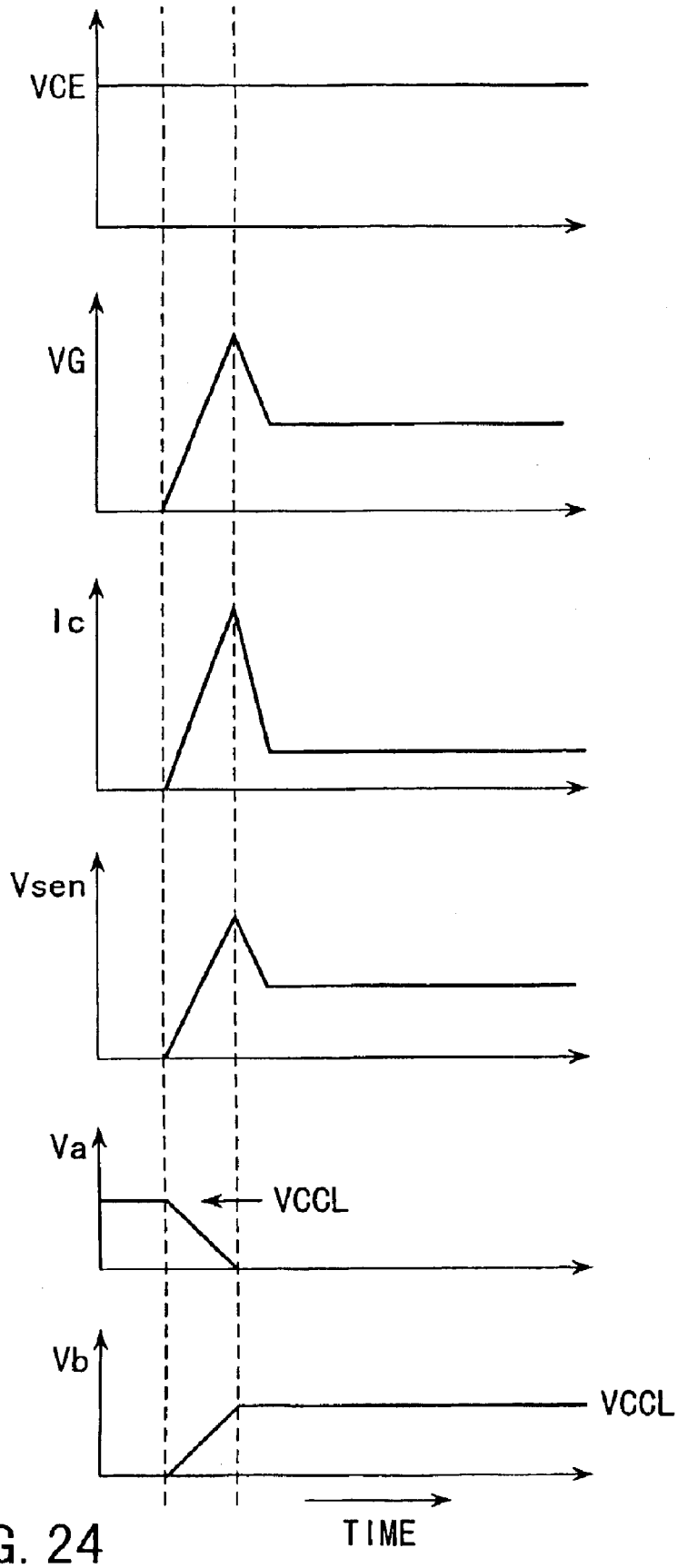
Figure 25:
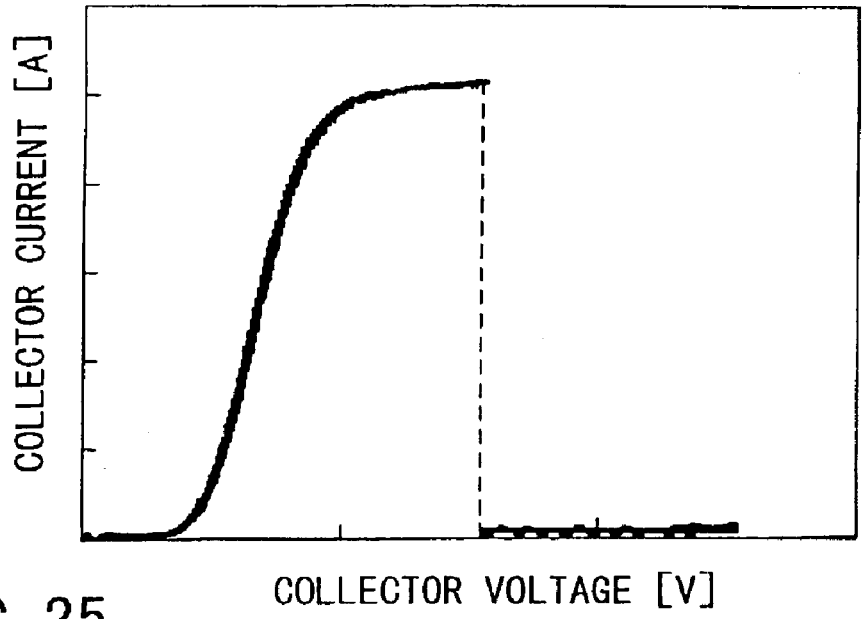
Figure 26:
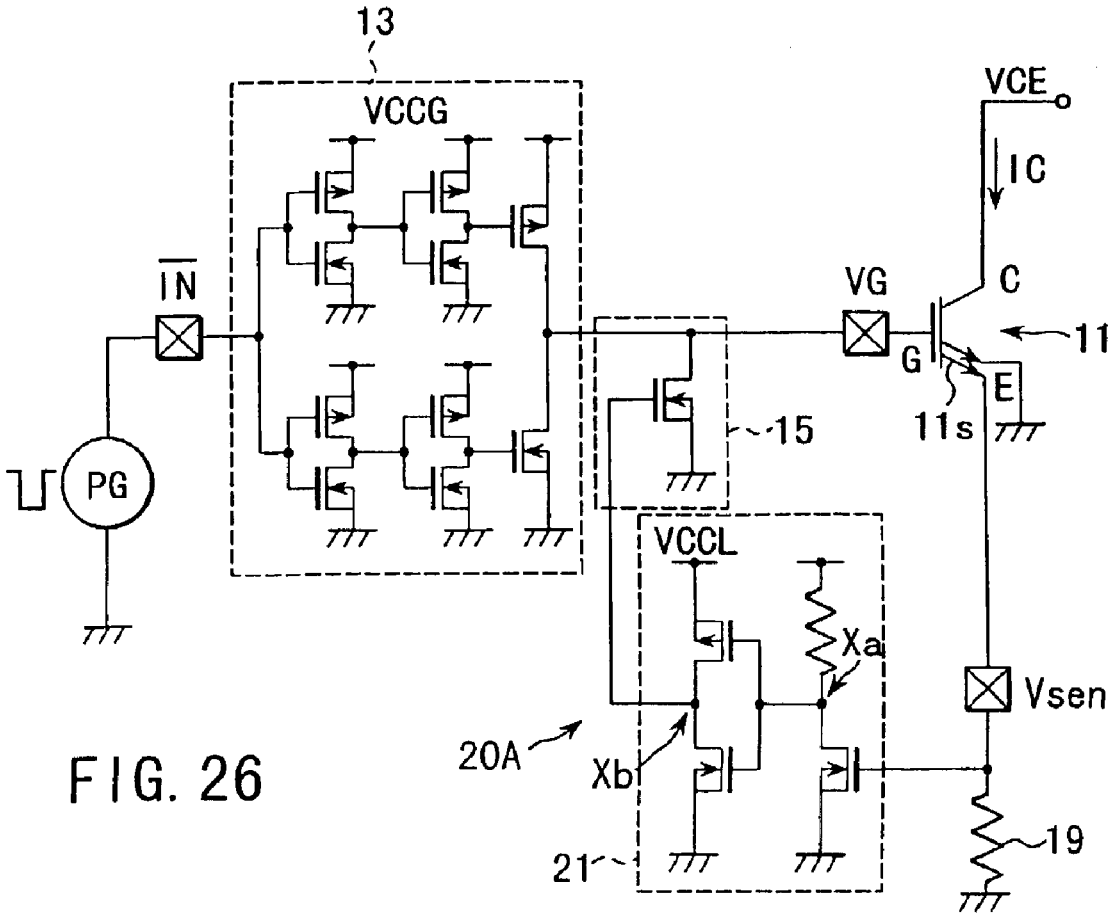
Figure 27:
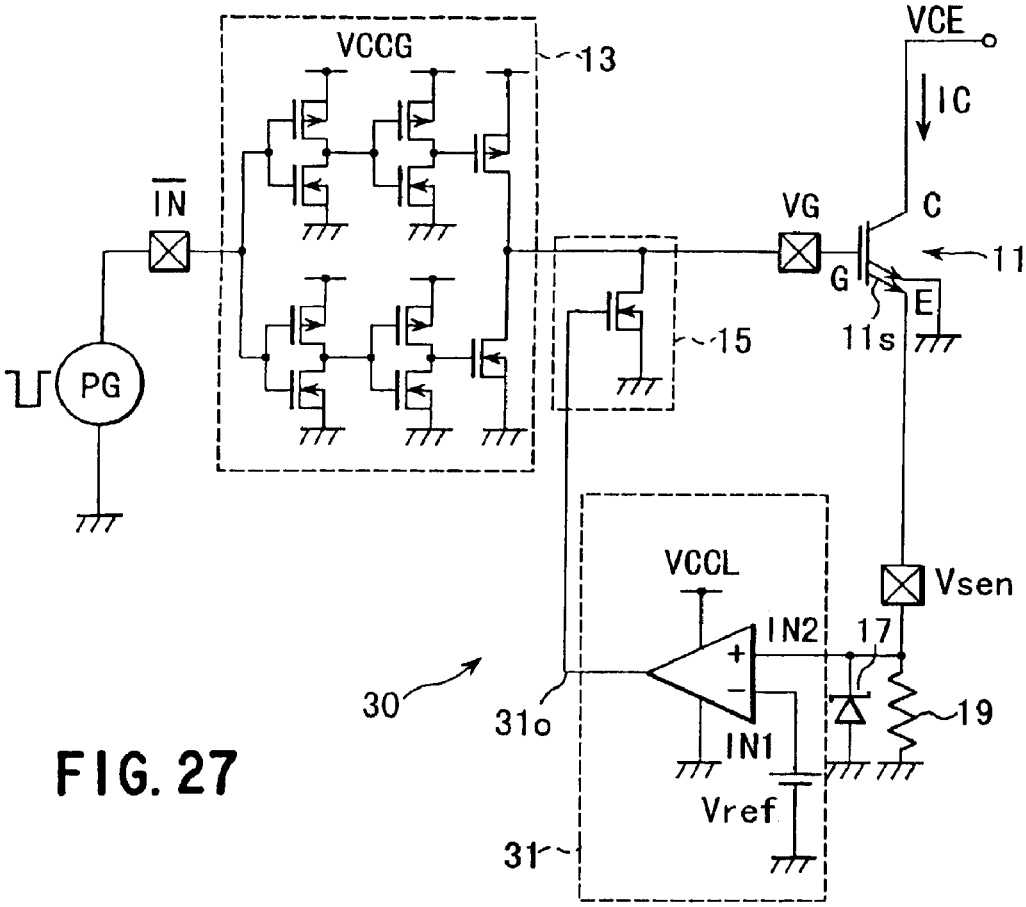
Figure 28:
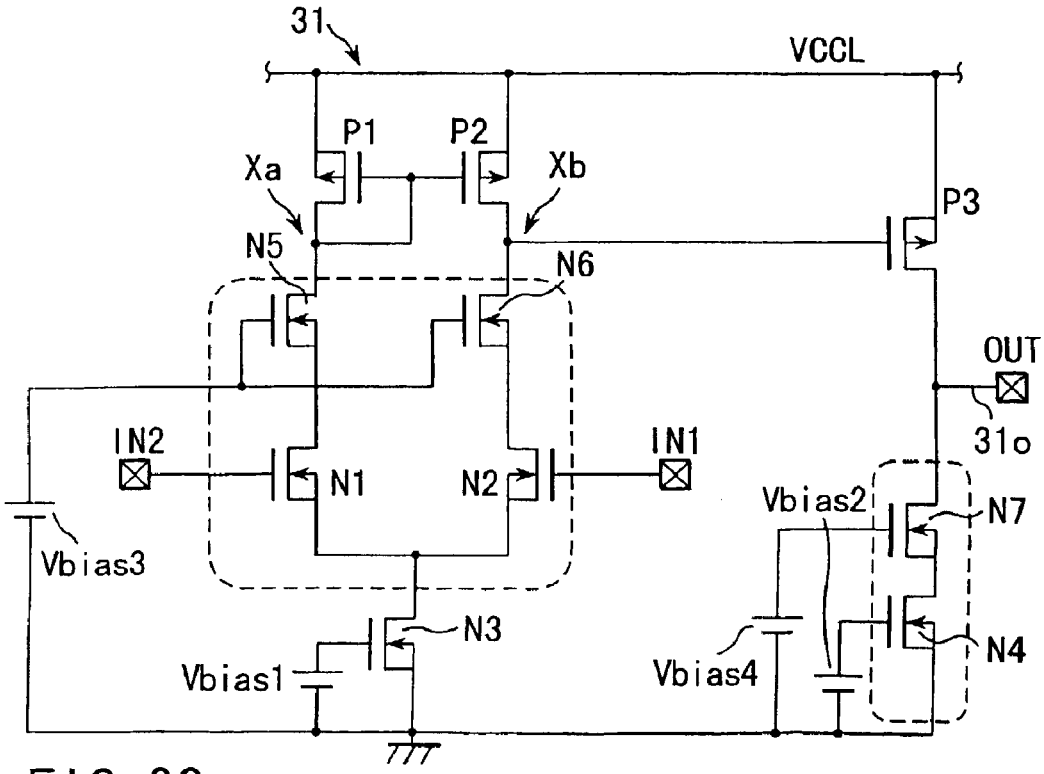
Figure 29:
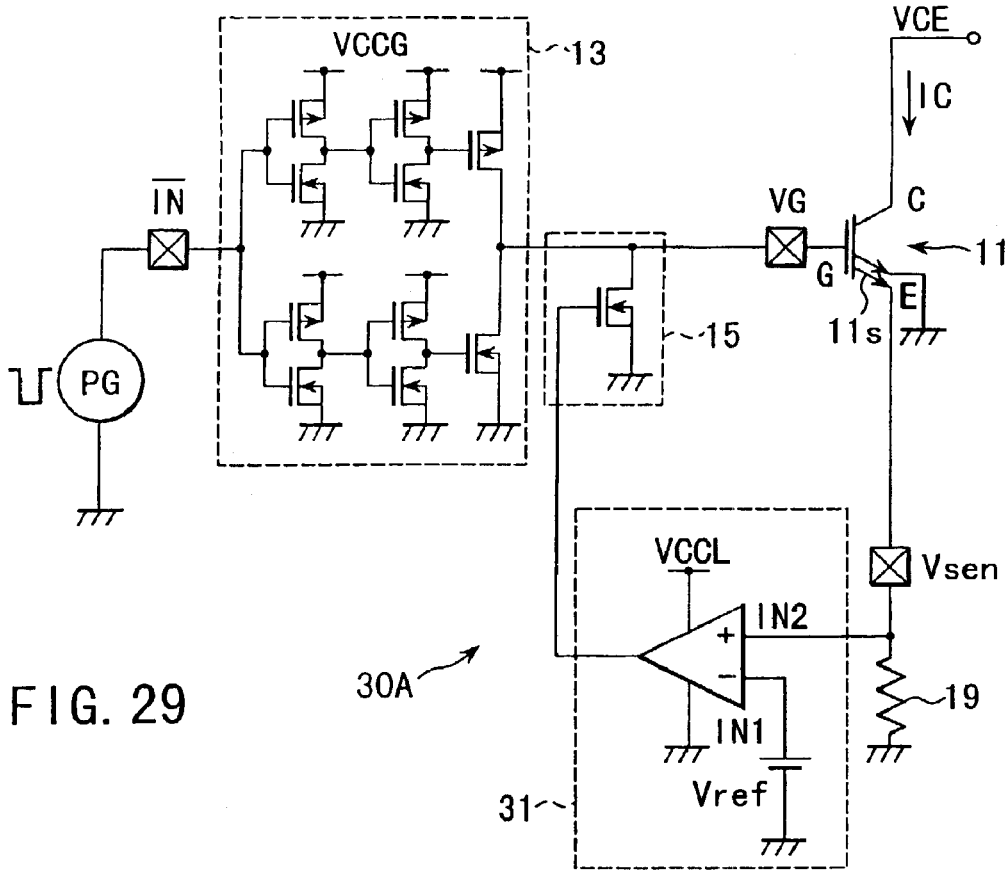
Figure 30:
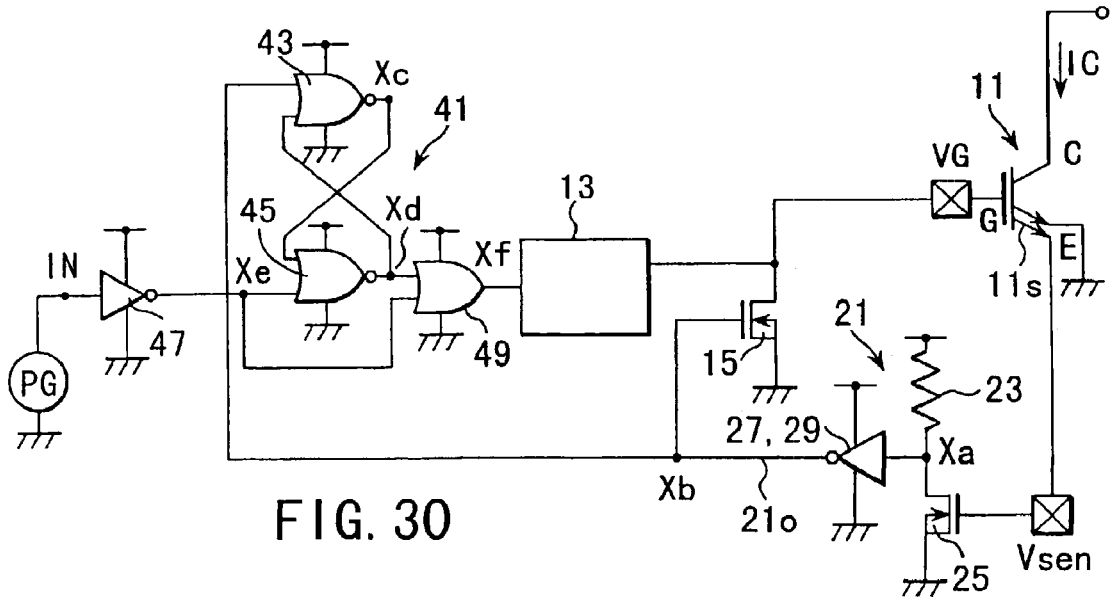
Figure 31:
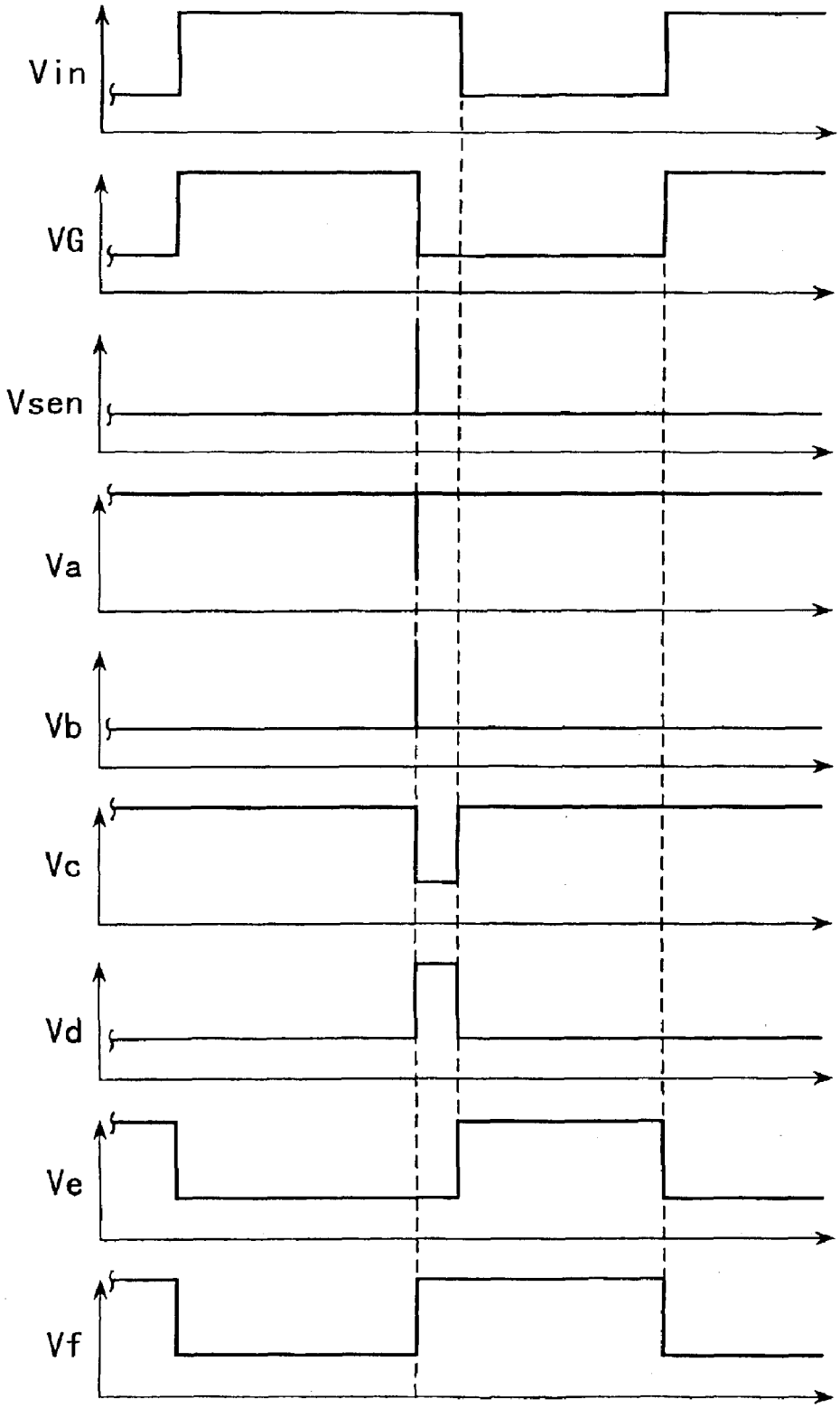
Figure 32:
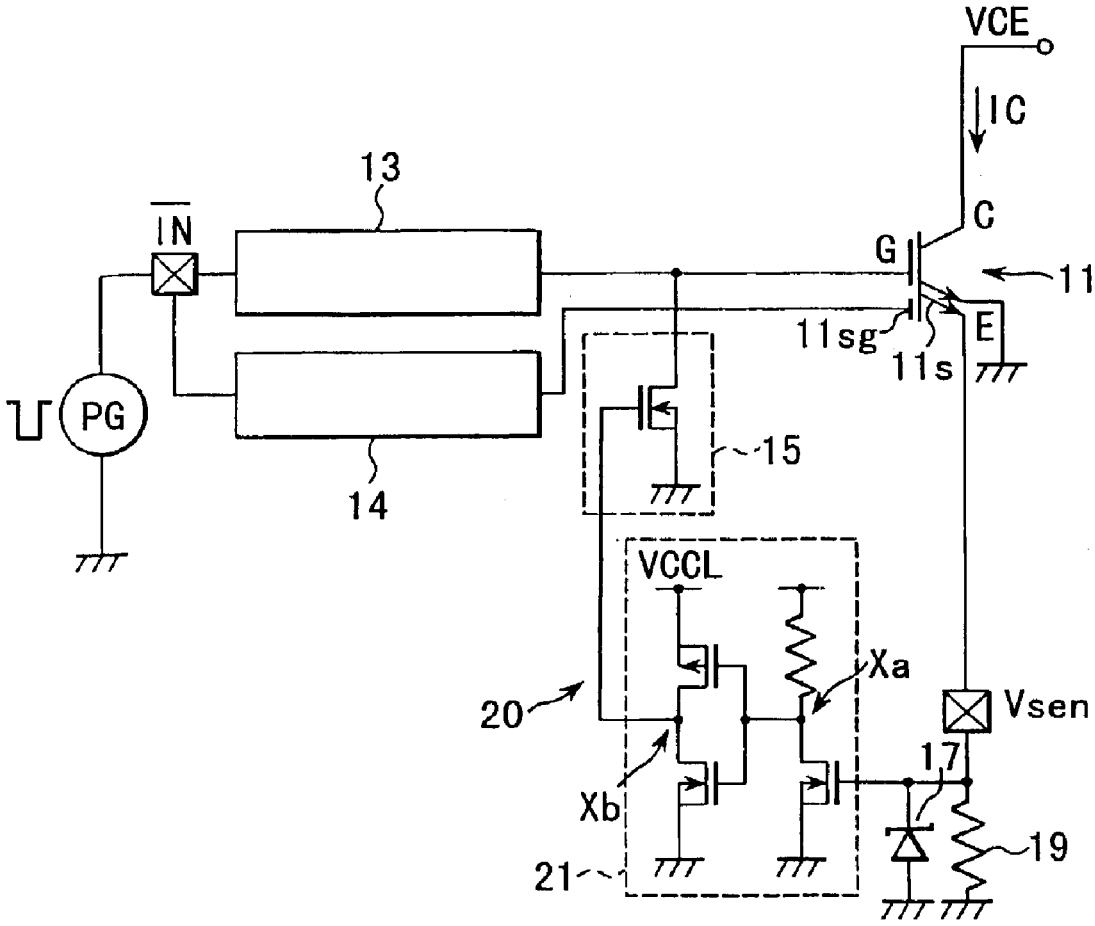
Figure 33:
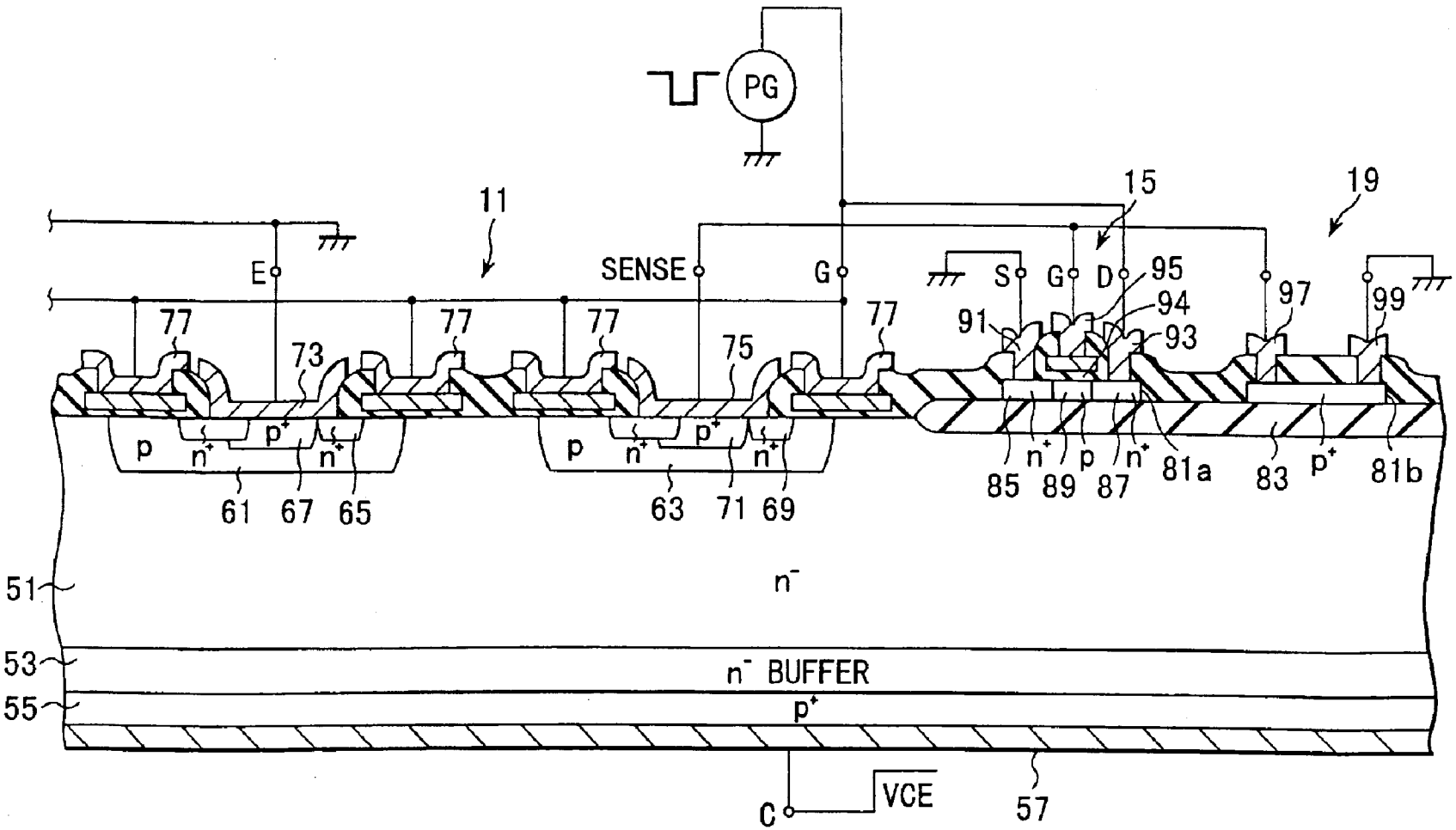

According to a second aspect of the present invention, there is provided a semiconductor protection device for suppressing, to not more than a set value, a current flowing through a main semiconductor switch, which has a main control electrode connected to a control power supply, and first and second main electrodes forming part of a main circuit, comprising:

a switching element formed using a semiconductor layer as an active region, the switching element being connected to a node between the control power supply and the main control electrode, and having first and second terminals configured to provide a bypass which is opened/closed depending on the set value, and a control terminal for controlling conduction between the first and second terminals; and a sense circuit connecting a sense terminal, which flows a sense current branching from a current flowing characteristics of a p-type polysilicon MOSFET;

FIG. 3 is a circuit diagram showing a conventional comparator circuit (n-type MOSFET input type);

FIG. 4 is a graph showing the characteristics of a sample of the comparator circuit shown in FIG. 3 that is constituted using a polysilicon MOSFET as each MOSFET;

FIG. 5 is a circuit diagram showing a conventional comparator circuit (p-type MOSFET input type);

FIG. 6 is a graph showing the characteristics of a sample of the comparator circuit shown in FIG. 5 that is constituted using a polysilicon MOSFET as each MOSFET;

FIG. 7 is a circuit diagram showing a conventional inverter circuit;

FIG. 8 is a graph showing the characteristics of a sample of the inverter circuit shown in FIG. 7 that is constituted using a polysilicon MOSFET as each MOSFET;

FIG. 9 is a circuit diagram showing a conventional NAND gate (2-input type) circuit;

FIG. 10 is a graph showing the characteristics of a sample of the NAND gate circuit shown in FIG. 9 that is constituted using a polysilicon MOSFET as each MOSFET;

FIG. 11 is a circuit diagram showing a conventional NOR gate (2-input type) circuit;

FIG. 12 is a graph showing the characteristics of a sample of the NOR gate circuit shown in FIG. 11 that is constituted using a polysilicon MOSFET as each MOSFET;

FIG. 13 is a circuit diagram showing a comparator circuit (n-type MOSFET input type) according to an embodiment of the present invention;

FIG. 14 is a graph showing the characteristics of the embodiment of the comparator circuit shown in FIG. 13 that is constituted using a polysilicon MOSFET as each MOSFET;

FIG. 15 is a circuit diagram showing a comparator circuit (p-type MOSFET input type) according to another embodiment of the present invention;

FIG. 16 is a graph showing the characteristics of the embodiment of the comparator circuit shown in FIG. 15 that is constituted using a polysilicon MOSFET as each MOSFET;

FIG. 17 is a circuit diagram showing an inverter circuit according to still another embodiment of the present invention;

FIG. 18 is a graph showing the characteristics of the embodiment of the inverter circuit shown in FIG. 17 that is constituted using a polysilicon MOSFET as each MOSFET;

FIG. 19 is a circuit diagram showing a NAND gate (2-input type) circuit according to still another embodiment of the present invention;

FIG. 20 is a graph showing the characteristics of the embodiment of the NAND gate (2-input type) circuit shown in FIG. 19 that is constituted using a polysilicon MOSFET as each MOSFET;

FIG. 21 is a circuit diagram showing a NOR gate (2-input type) circuit according to still another embodiment of the present invention;

FIG. 22 is a graph showing the characteristic of the embodiment of the NOR gate (2-input type) circuit shown in FIG. 21 that is constituted using a polysilicon MOSFET as each MOSFET;

FIG. 23 is a circuit diagram showing a semiconductor protection device together with a main semiconductor switch according to still another embodiment of the present invention;

FIG. 24 is a timing chart showing changes in voltages at respective portions until an IGBT is protected after it short-circuits in the semiconductor protection device shown in FIG. 23;

FIG. 25 is a graph showing the relationship between the collector voltage and collector current of the IGBT in the semiconductor protection device shown in FIG. 23;

FIG. 26 is a circuit diagram showing a modification of the semiconductor protection device shown in FIG. 23 together with a main semiconductor switch;

FIG. 27 is a circuit diagram showing a semiconductor protection device together with a main semiconductor switch according to still another embodiment of the present invention;

FIG. 28 is a circuit diagram showing details of a comparator in the semiconductor protection device shown in FIG. 27;

FIG. 29 is a circuit diagram showing a modification of the semiconductor protection device shown in FIG. 27 together with a main semiconductor switch;

FIG. 30 is a logic circuit diagram showing a semiconductor protection device together with a main semiconductor switch according to still another embodiment of the present invention;

FIG. 31 is a timing chart showing changes in voltages at respective portions in protecting an IGBT in the semiconductor protection device shown in FIG. 30;

FIG. 32 is a circuit diagram showing a semiconductor protection device together with a main semiconductor switch according to still another embodiment of the present invention; and FIG. 33 is a sectional view showing a structure in which an IGBT serving as a main semiconductor switch and a shunt N-MOSFET are integrated on the same substrate.

DETAILED DESCRIPTION OF THE INVENTION

During the development of the present invention, the present inventors have studied problems arising when single-crystalline silicon MOSFETs are simply replaced by poly-crystalline (polysilicon) MOSFETS, while using the structure of a single-crystalline silicon circuit as it is. As a result, the present inventors have attained the following findings.

FIG. 3 is a circuit diagram showing a conventional comparator circuit which assumes the use of single-crystalline silicon MOSFETs. Note that the characteristics of n-type MOSFETs N1 and N2 are the same, and those of p-type MOSFETs P1 and P2 are also the same.

Using as each MOSFET a single-crystalline silicon MOSFET exhibiting excellent saturation characteristics, the comparator circuit shown in FIG. 3 operates as follows. The "excellent saturation characteristics" mean that an increase in drain current substantially saturates with an increase in drain voltage within the operating range.

More specifically, since the n-type MOSFETs N1 and N2 share a source, currents I1 and I2 which satisfy I1>I2 flow for IN1>IN2 regardless of the source-drain voltage so long as N1 and N2 operate in the saturation region. If the current I1 flows through a point Xa of a current mirror circuit made up of the p-type MOSFETs P1 and P2, a current I3 equal to the current I1 flows through a point Xb. Currents at the point Xb satisfy I3>I2, and the voltage at the point Xb rises. The rise of the voltage at the point Xb turns off a p-type MOSFET P3 at the output stage to drop the OUT voltage. For IN1>IN2, the comparator circuit operates with an opposite voltage-current relationship.

To the contrary, using as each n-type MOSFET an n-type polysilicon MOSFET exhibiting poor saturation characteristics, the comparator circuit shown in FIG. 3 suffers the following problem to decrease the I/O gain. The "poor saturation characteristics" mean that an increase in drain current does not substantially saturate with an increase in drain voltage within the operating range.

With the use of n-type polysilicon MOSFETs, the currents I1, I2, and I3 changes depending on the source-drain voltage. For example, for IN1>IN2, the current I1 increases, and the current I2 decreases. If the current I1 flows through the point Xa of the current mirror circuit made up of P1 and P2, the current I3 equal to the current I1 flows through the point Xb. If the current I3 flows, the voltage at the point Xb starts rising, but the rise of the voltage is suppressed by the following phenomenon.

The current I3 of P2 increases→The voltage at the point Xb rises.→The drain-source voltage of N2 rises.→The current I2 of N2 increases.→This suppresses the rise of the voltage at the point Xb.

This problem also occurs at the output stage to suppress the rise of the OUT voltage.

A current I5 of P3 increases.→The OUT voltage rises.→The drain-source voltage of N4 rises.→A current I4 of N4 increases.→This suppresses the rise of the OUT voltage.

For IN1<I2, an opposite phenomenon occurs to suppress the drop of the voltage at the point Xb or the OUT voltage.

FIG. 4 is a graph showing the characteristics of a sample of the comparator circuit shown in FIG. 3 that is constituted using a polysilicon MOSFET as each MOSFET. As shown in FIG. 4, the I/O gain of this circuit is about 4 at maximum. In other words, if a comparator circuit as shown in FIG. 3 that assumes the use of single-crystalline silicon MOSFETs is constituted using polysilicon MOSFETs, the I/O gain becomes low.

FIG. 5 is a circuit diagram showing another conventional comparator circuit that assumes the use of single-crystalline silicon MOSFETs. The comparator circuit in FIG. 3 receives an input signal by an n-type MOSFET, whereas the comparator circuit in FIG. 5 receives an input signal by a p-type MOSFET. None that the characteristics of n-type MOSFETs N1 and N2 are the same, and those of p-type MOSFETs P1 and P2 are also the same.

Using as each MOSFET a single-crystalline silicon MOSFET exhibiting excellent saturation characteristics, the comparator circuit shown in FIG. 5 operates as follows. Since the p-type MOSFETs P1 and P2 share a source, currents I1 and I2 which satisfy I1>I2 flow for IN1<IN2. If the current I1 flows through a point Xa of a current mirror circuit made up of N1 and N2, a current I3 equal to the current I1 flows through a point Xb regardless of the source-drain voltage as far as the n-type MOSFETs N1 and N2 operate in the saturation region. Currents at the point Xb satisfy I3>I2, and the voltage at the point Xb drops. The drop of the voltage at the point Xb turns off an n-type MOSFET N3 at the output stage to raise the OUT voltage. For IN1>IN2, the comparator circuit operates with an opposite voltage-current relationship.

To the contrary, using as each n-type MOSFET an n-type polysilicon MOSFET exhibiting poor saturation characteristics, the comparator circuit shown in FIG. 5 poses the following problem to decrease the I/O gain. With the use of n-type polysilicon MOSFETs, the current I1, I2, and I3 change depending on the source-drain voltage. For example, for IN1<IN2, the current I1 increases, and the current I2 decreases. If the current I1 flows through the point Xa of the current minor circuit made of N1 and N2, the current I3 equal to the current I1 flows through the point Xb. If the current I3 flows, the voltage at the point Xb starts dropping, but the drop of this voltage is suppressed by the following phenomenon.

The current I3 of N2 increases.→The voltage at the point Xb drops.→The drain-source voltage of N2 drops.→The current I3 of N2 decreases.→This suppresses the drop of the voltage at the point Xb.

The same problem also occurs at the output stage to suppress the rise of the OUT voltage.

A current I5 of N3 decreases.→The OUT voltage rises.→The drain-source voltage of N3 rises.→The current I5 of N3 increases.→This suppresses the rise of the OUT voltage.

For IN1>I2, an opposite phenomenon occurs to suppress the rise of the voltage at the point Xb and the drop of the OUT voltage.

FIG. 6 is a graph showing the characteristics of a sample of the comparator circuit shown in FIG. 5 that is constituted using a polysilicon MOSFET as each MOSFET. As shown in FIG. 6, the I/O gain of this circuit is about 5 at maximum. In other words, if a comparator circuit as shown in FIG. 5 that assumes the use of single-crystalline silicon MOSFETs is constituted using polysilicon MOSFETS, the I/O gain becomes low.

FIG. 7 is a circuit diagram showing an inverter circuit as an example of a conventional logic gate that assumes the use of single-crystalline silicon MOSFETs.

Using as each MOSFET, a single-crystalline silicon MOSFET exhibiting excellent saturation characteristics, the inverter circuit shown in FIG. 7 operates as follows. When IN shifts from GND level to power supply level, a current I1 of an n-type MOSFET N1 increases, a current I2 of a p-type MOSFET P1 decreases, and the OUT voltage drops. Through this process, OUT settles at GND level. When In shifts from power supply level to GND level, OUT settles at power supply level through a reverse process.

To the contrary, using as each n-type MOSFET an n-type polysilicon MOSFET exhibiting power saturation characteristics, the inverter circuit shown in FIG. 7 poses the following problem to decrease the I/O gain. When IN shifts from GND level to power supply level, the current I1 of the n-type MOSFET N1 increases, the current I2 of the p-type MOSFET P1 decreases, and the OUT voltage drops. At this time, the drain-source voltage of the n-type MOSFET N1 drops, and the current I1 of N1 decreases to suppress the drop of the OUT voltage. When IN shifts from power supply level to GND level, the rise of the OUT voltage is suppressed through a reverse process.

FIG. 8 is a graph showing the characteristic of a sample of the inverter circuit shown in FIG. 7 that is constituted using polysilicon MOSFETs as each MOSFET. As shown in FIG. 7, the I/O gain of this circuit is about 4 at maximum. That is, if an inverter circuit as shown in FIG. 7 that assumes the use of single-crystalline silicon MOSFETs is constituted using polysilicon MOSFETs, the I/O gain becomes low.

FIGS. 9 and 11 are circuit diagrams, respectively, showing a NAND gate (2-input type) circuit and NOR gate (2-input type) circuit as other examples of the conventional logic gate that assumes the use of single-crystalline silicon MOSFETs.

The operating principle of the circuits shown in FIGS. 9 and 11 is basically the same as that of the inverter circuit shown in FIG. 7. In the following description, the operations of the circuits shown in FIGS. 9 and 11 will be explained in common where IN1=power supply level is set in the NAND gate circuit shown in FIG. 9, and IN1=GND level is set in the NOR gate circuit shown in FIG. 11.

Using as each MOSFET a single-crystalline silicon MOSFET exhibiting excellent saturation characteristics, the circuits shown in FIGS. 9 and 11 operate as follows. When IN2 shifts from GND level to power supply level, a current I1 of an n-type MOSFET N2 increases, a current I2 of a p-type MOSFET P2 decreases, and the OUT voltage drops. Through this process, OUT settles a GND level. When IN2 shifts from power supply level to GND level, OUT settles at power supply level through a reverse process.

To the contrary, using as each n-type MOSFET an n-type polysilicon MOSFET exhibiting poor saturation characteristics, the circuits shown in FIGS. 9 and 11 suffer the following problem to decrease the I/O gain. When IN2 shifts from GND level to power supply level, the current I1 of the n-type MOSFET N2 increases, the current I2 of the p-type MOSFET P2 decreases, and the OUT voltage drops. At this time, the drain-source voltage of the n-type MOSFET N2 drops, and the current I1 of N2 decreases to suppress the drop of the OUT voltage. When IN2 shifts from power supply level to GND level, the rise of the OUT voltage is suppressed through a reverse process.

FIGS. 10 and 12 are graphs showing the characteristics of samples of the circuits shown in FIGS. 9 and 11 which are constituted using a polysilicon MOSFET as each MOSFET. As shown in FIGS. 10 and 12, the I/O gains of these circuits are about 4 at maximum. If circuits as shown in FIGS. 10 and 12 that assume the use of single-crystalline silicon MOSFETs are constituted using polysilicon MOSFETs, the I/O gains become low.

A polysilicon MOSFET, and particularly an n-type MOSFET having a channel length of 3 $\mu$m or less hardly exhibit saturation characteristics. For this reason, if a polysilicon MOSFET is used for a comparator circuit or CMOS logic gate circuit using a conventional single-silicon MOSFET, as described above, the I/O gain decreases. The decrease in I/O gain may change the threshold voltage of the comparator circuit or delay the transmission time.

Embodiments of the present invention based on these findings will be explained with reference to the several views of the accompanying drawing. In the following description, the same reference numerals denote the same parts having almost the same functions and arrangements, and a repetitive description is made only if necessary. In the following embodiments, a polysilicon layer used as the active region of each element such as a MOSFET is generally obtained by dividing a polysilicon film into a plurality of device regions. This technique is disclosed in U.S. Pat. No. 5,985,708, issued Nov. 16, 1999 to Akio Nakagawn et al., the teachings of which are incorporated herein by reference.

FIG. 13 is a circuit diagram showing a comparator circuit according to an embodiment of the present invention. This comparator circuit is formed using a polysilicon MOSFET as each MOSFET.

The differential amplifier of the comparator circuit comprises n-type MOSFETs N1 and N2 for receiving an input signal, p-type MOSFETs P1 and P2 of a current mirror circuit, and a n-type MOSFET N3 of a current source circuit. The output stage comprises a p-type MOSFET P3 for transmitting a signal from the differential amplifier to the next stage, and an n-type MOSFET N4 of a current source circuit.

The differential amplifier further comprises n-type MOSFETs N5 and N6 respectively series-connected to the drains of the n-type MOSFETs N1 and N2 for receiving an input signal. The output stage further comprises an n-type MOSFET N7 series-connected to the drain of the n-type MOSFET N4 of the current source circuit. The gates of the n-type MOSFETs N5 and N6, and that of the n-type MOSFET N7 are respectively connected to voltage bias circuits Vbias3 and Vbias4. The additional n-type MOSFETs N5, N6, and N7 suppress variations in voltages at points Xa, Xb, and OUT caused by poor saturation characteristics of the main n-type MOSFETs N1, N2, and N4.

The comparator circuit outputs OUT=GND level for IN1>IN2, and OUT=power supply level for IN1>IN2.

The operating principle of the additional n-type MOSFETs N5, N6 and N7 will be explained by exemplifying the n-type MOSFET N7 at the output stage.

The n-type MOSFET N7 suppresses variations in voltage at a point Xf, i.e., the drain voltage of the n-type MOSFET N4. By suppressing variations in the drain voltage of N4, drain voltage dependency caused by poor saturation characteristics is reduced to allow flowing a drain current corresponding to the gate voltage of N4. In other words, by series-connecting the n-type MOSFET N7 which receives a bias voltage at its gate to the main n-type MOSFET N4, characteristics in the use of a single-crystalline silicon MOSFET having excellent saturation characteristics can be obtained.

The principle of suppressing the voltage at the point Xf by the additional n-type MOSFET N7 is as follows. The gate of N7 receives a constant bias voltage Vbias4 from the voltage bias circuit. Letting Vth(N7) be the threshold of N7, a source voltage (voltage at the point Xf) Vf of N7 is given by Vf=Vbias4−Vth(N7). Vth(N7) depends on a drain current (15), but acts to reduce variations in the voltage Vf at the point Xf because of the following reasons. For example, when the voltage at the point Xf rises to increase the drain current I5 of N4, the drain current of N7 also increases, and Vth(N7) also rises to drop the voltage at the point Xf. To the contrary, if the voltage Vf at the point Xf drops, Vth(N7) finally raises the voltage Vf at the point Xf.

Note that the drain voltage of N7, i.e., OUT voltage varies, the current ability of N7 changes depending on the drain-source voltage. However, by setting the MOSFET size and adjusting the current ability of the MOSFET itself so as to satisfy the condition: (drain current ability of N7)>(drain current ability of N4), the finally flowing current I5 is limited by the drain current ability of N4. This adjustment can reduce the adverse effect of N7 generated when the OUT voltage varies.

The operations of the additional n-type MOSFETs N5, N6, and N7 in the whole comparator circuit shown in FIG. 13 will be described.

For IN1>IN2, the current I1 increases, and the current I2 decreases in the differential amplifier. If the current I1 flows through the point Xa of the current mirror circuit made up of P1 and P2, a current I3 equal to the current I1 flows through the point Xb. After the current 13 flows, the voltage at the point Xb starts rising. At this time, the influence of drain-source voltage dependency of N2 is reduced by N6 to suppress an increase in the current I2. Hence, the voltage at the point Xb easily rises. Similarly, the influence of drain-source voltage dependency of N1 is reduced by N5 to suppress a decrease in the current I1.

If the voltage at the point Xb rises, a drain current 16 of P3 at the output stage decreases to drop the OUT voltage. At this time, the influence of drain-source voltage dependency of N4 is reduced by N7 to suppress a decrease in the current I5. Thus, the OUT voltage easily drops.

For IN1>IN2, the current-voltage relationship is reversed. The influence of drain-source voltage dependency of the main n-type MOSFETs N1, N2, and N4 exhibiting poor saturation characteristics is reduced by the additional n-type MOSFETs N5, N6, and N7.

FIG. 14 is a graph showing the characteristics of the embodiment of the comparator circuit shown in FIG. 13 that is constituted using a polysilicon MOSFET as each MOSFET. As shown in FIG. 14, the I/O gain of this circuit is about 13 at maximum, which is much higher than the I/O gain (4 at maximum) shown in FIG. 4. From this, even if n-type polysilicon MOSFETs exhibiting almost no saturation characteristics are used, the I/O gain of the comparator circuit can be increased by additionally series-connecting n-type MOSFETs in the differential amplifier circuit and current source circuit.

FIG. 15 is a circuit diagram showing a comparator circuit according to another embodiment of the present invention. This comparator circuit is formed using a polysilicon MOSFET as each MOSFET. The comparator circuit in FIG. 13 receives an input signal by an n-type MOSFET, whereas the comparator circuit in FIG. 15 receives an input signal by a p-type MOSFET.

The differential amplifier of the comparator circuit comprises p-type MOSFETs P1 and P2 for receiving an input signal. n-type MOSFETs N1 and N2 of a current mirror circuit, and a p-type MOSFET P3 of a current source circuit. The output stage comprises an n-type MOSFET N3 for transmitting a signal from the differential amplifier to the next stage, and a p-type MOSFET P4 of a current source circuit.

The differential amplifier further comprises n-type MOSFETs N4 and N5 respectively series-connected to the drains of the n-type MOSFETs N1 and N2 of the current mirror circuit. The output stage further comprises an n-type MOSFET N6 series-connected to the drain of the n-type MOSFET N3 of the signal transmission circuit. The gates of the n-type MOSFETs N4 and N5, and that of the n-type MOSFET N6 are respectively connected to voltage bias circuits Vbias1 and Vbias2. The additional n-type MOSFETs N4, N5, and N6 suppress variations in voltages at points Xa, Xb, and OUT caused by poor saturation characteristics of the main n-type MOSFETs N1, N2, and N3.

The comparator circuit outputs OUT=GND level for IN1>IN2, and OUT=pore supply level for IN1<IN2.

The operations of the additional n-type MOSFETs N4, N5, and N6 in the whole comparator circuit shown in FIG. 15 will be described.

For IN1<IN2, a current I1 increases, and a current I2 decreases in the differential amplifier. If the current I1 flows through the point Xa of the current mirror circuit made up of N1, N2, N4, and N5, a current I3 equal to the current I1 flows through the point Xb. Then, the currents at the point Xb satisfy I3>I2, and the voltage at the point Xb starts dropping. At this time, the influence of drain-source voltage dependency of N2 is reduced by N5 to suppress a decrease in the current I3. Hence, the voltage at the point Xb easily drops. Similarly, the influence of drain-source voltage dependency of Ni is reduced by N4 to suppress a decrease in the current I1.

If the voltage at the point Xb drops, a drain current 16 of N3 at the output stage decreases to drop the OUT voltage. At this time, the influence of drain-source voltage dependency of N3 is reduced by N6 to suppress an increase in the current 16. Thus, the OUT voltage easily rises.

For IN1>IN2, the current-voltage relationship is reversed. The influence of drain-source voltage dependency of the main n-type MOSFETs N1, N2, and N3 exhibiting poor saturation characteristics is reduced by the additional n-type MOSFETs N4, N5, and N6.

FIG. 16 is a graph showing the characteristics of this embodiment of the comparator circuit shown in FIG. 15 that is constituted using a polysilicon MOSFET as each MOSFET. As shown in FIG. 16, the I/O gain of the circuit is about 12 at maximum, which is much higher than the I/O gain (5 at maximum) shown in FIG. 6. From this, even if n-type polysilicon MOSFETs exhibiting almost no saturation characteristics are used, the I/O gain of the comparator circuit can be increased by additionally series-connecting n-type MOSFETs in the current mirror circuit and signal transmission circuit.

FIG. 17 is a circuit diagram showing an inverter circuit according to still another embodiment of the present invention. This inverter circuit is formed using a polysilicon MOSFET as each MOSFET.

In the inverter circuit, the gates of n- and p-type MOSFETs N1 and P1 are commonly connected to IN, and their drains are commonly connected to OUT. The sources of the n- and p-type MOSFETs N1 and P1 are respectively connected to the GND and power supply.

The inverter circuit further comprises n- and p-type MOSFETs N2 and P2 respectively series-connected between the drains of the N- and p-type MOSFET N1 and P1 and OUT. The gates of the n- and p-type MOSFET N2 and P2 are respectively connected to voltage bias circuits Vbias1 and Vbias2. The additional n- and p-type MOSFETs N2 and P2 suppress variations in OUT voltage caused by poor saturation characteristics of the main n- and p-type MOSFETs N1 and P1.

The inventor circuit outputs OUT=GND level for a logic input IN=power supply level, and OUT=power supply level for IN=GND level. That is, the inverter circuit outputs a logic signal inverted to an input logic signal.

The operations of the additional n- and p-type MOSFETs N2 and P2 in the whole inverter circuit shown in FIG. 17 will be described.

When IN shifts from GND level to power supply level, a current I1 of the n-type MOSFET N1 increases, a current I2 of the p-type MOSFET P1 decreases, and the OUT voltage drops. At this time, a decrease in current ability by drain-source voltage dependency of N1 is reduced by N2 to easily increase the current I1. In addition, an increase in current ability by drain-source voltage dependency of P1 is reduced by P2 to easily drop the OUT voltage. When IN shifts from power supply level to GND level, the OUT voltage easily rises through a reverse process.

FIG. 18 is a graph showing the characteristic of the embodiment of the inverter circuit shown in FIG. 17 that is constituted using a polysilicon MOSFET as each MOSFET. As shown in FIG. 18, the I/O gain of this circuit is about 10 at maximum, which is much higher than the I/O gain (4 at maximum) shown in FIG. 8. From this, even if polysilicon MOSFETs exhibiting poor saturation characteristics are used, the I/O gain of the inverter circuit can be increased by additionally series-connecting n- and p-type MOSFETs.

FIG. 19 is a circuit diagram showing a NAND gate (2-input type) circuit according to skill another embodiment of the present invention. This NAND gate circuit is formed using a polysilicon MOSFET as each MOSFET.

The NAND gate circuit comprises two series-connected n-type MOSFETs N1 and N2 and two parallel-connected p-type MOSFETs P1 and P2. IN1 is commonly connected the gates of the n- and p-type MOSFETs N1 and P1, while IN2 is commonly connected those of the n- and p-type MOSFETs N2 and P2, OUT is commonly connected to the drains of the n- and p-type MOSFETs N2, P1, and P2. The sources of the p-type MOSFETs P1 and P2 are connected to the power supply, and that of the n-type MOSFET N1 is connected to GND.

The NAND gate circuit further comprises n- and p-type MOSFETs N3 and P3 respectively connected between the drain of the n-type MOSFET N2 and those of the p-type MOSFETs P1 and P2, and OUT. The gates of the n- and p-type MOSFETs N3 and P3 are respectively connected to voltage bias circuits Vbias1 and Vbias2. These additional n- and p-type MOSFETs N3 and P3 suppress variations in OUT voltage caused by poor saturation characteristics of the main n- and p-type MOSFETs N2, P1 and P2.

The NAND gate circuit outputs OUT=GND level only for the logic input IN1=power supply level and IN2=power supply level, and outputs OUT=power supply level for the logic input=another level.

The operation of the additional n- and p-type MOSFETs N3 and P3 in the whole NAND gate circuit shown in FIG. 19 will be explained.

When IN2 shifts from GND level to power supply level while IN1 is at power supply level, a current I1 of N2 increases, a current I2 of the p-type MOSFET P2 decreases, and the OUT voltage drops. At this time, a decrease in current ability by drain-source voltage dependency of N2 is reduced by N3 to easily increase the current I1. An increase in current ability to drain-source voltage dependency of P1 and P2 is reduced by P3 to easily drop the OUT voltage. When IN2 shifts from power supply level to GND level, the OUT voltage easily rises through a reverse process.

FIG. 20 is a graph showing the characteristics of the embodiment of the NAND gate circuit shown in FIG. 19 that is constituted using a polysilicon MOSFET as each MOSFET. As shown in FIG. 20, the I/O gain of this circuit is about 8 at maximum, which is much higher than the I/O gain (4 at maximum) shown in FIG. 10. Even if polysilicon MOSFETs exhibiting poor saturation characteristics are used, the I/O gain of the NAND gate circuit can be increased by additionally series-connecting n- and p-type MOSFETs.

FIG. 21 is a circuit diagram showing a NOR gate (2-input type) circuit according to still another embodiment of the present invention. This NOR gate circuit is formed using a polysilicon MOSFET as each MOSFET.

The NOR gate circuit comprises two parallel-connected n-type MOSFETs N1 and N2 and two series-connected p-type MOSFETs P1 and P2. IN1 is commonly connected to the gates of the n- and p-type MOSFETs N1 and P1, while IN2 is commonly connected to those of the n- and p-type MOSFETs N2 and P2. OUT is commonly connected to the drains of the p- and n-type MOSFETs P2, N1, and N2. The source of the p-type MOSFET P1 is connected to the power supply, and those of the n-type MOSFETs N1 and N2 are connected to GND.

The NOR gate circuit further comprises n- and p-type MOSFETs N3 and P3 respectively connected between the drains of the n-type MOSFETs N1 and N2 and that of the p-type MOSFET P2, and OUT. The gates of the n- and p-type MOSFETs N3 and P3 are respectively connected to voltage bias circuits Vbias1 and Vbias2. These additional n- and p-type MOSFET N3 and P3 suppress variations in OUT voltage caused by poor saturation characteristics of the main n- and p-type MOSFETs N1, N2, and P1.

The NOR gate circuit outputs OUT=power supply level only for the logic input IN1=GND level and IN2=GND level, and outputs OUT=GND level for the logic input= another level.

The operations of the additional n- and p-type MOSFETs N3 and P3 in the whole NOR gate circuit shown in FIG. 21 will be explained.

When IN2 shifts from GND level to power supply level while IN1 is at GND level, a current I1 of N2 increases, a current I2 of the p-type MOSFET P2 decreases, and the OUT voltage drops. At this time, a decrease in current ability by drain-source voltage dependency of N1 and N2 is reduced by N3 to easily increase the current I1. An increase in current ability by drain-source voltage dependency of P2 is reduced by P3 to easily decrease the current I2. Therefore, the OUT voltage easily drops. When IN2 shifts from power supply level to GND level, the OUT voltage easily rises through a reverse process.

FIG. 22 is a graph showing the characteristics of the embodiment of the NOR gate circuit shown in FIG. 21 that is constituted using a polysilicon MOSFET as each MOSFET. As shown in FIG. 22, the I/O gain of this circuit is about 8 at maximum, which is much higher than the I/O gain (4 at maximum) shown in FIG. 12. Even if polysilicon MOSFETs exhibiting poor saturation characteristics are used, the I/O gain of the NOR gate circuit can be increased by additionally series-connecting n- and p-type MOSFETs.

The embodiments described with reference to FIGS. 13 to 22 can provide a polysilicon circuit such as a comparator circuit or CMOS logic gate circuit which can attain characteristics achieved when a MISFET having excellent saturation characteristics is used, by series-connecting an n-type polysilicon MISFET which receives a bias voltage at its gate to the drain of a main n-type polysilicon MISFET.

In the embodiments described with reference to FIGS. 13 to 22, the insulating film of the gate structure of each FET is not limited to an oxide film, and a so-called MIS structure (i.e., MISFET) can also be used.

FIG. 23 is a circuit diagram showing a semiconductor protection device together with a main semiconductor switch according to still another embodiment of the present invention. As shown in FIG. 23, and IGET 11 serving as a main semiconductor switch, i.e., insulated-gate semiconductor device comprises an emitter electrode directly connected to ground, a collector electrode connected to a circuit power supply of a voltage VCE via a load, and a gate, i.e., control electrode connected to a pulse generator PG serving as a control signal source via a gate driver 13 including a control power supply. The IGBT 11 further comprises a sense terminal 11s for flowing a sense current branching from an emitter-collector current. The sense terminal 11s is extracted while being insulated from the emitter. As will be described below, the IGBT 11 is formed using a single-crystalline silicon substrate as an active region.

The node between the gate driver 13 and the gate electrode of the IGBT 11, i.e., the intermediate point of a line connecting them is connected to the drain of an N-MOSFET 15 for shunting the current of the gate of the IGBT 11 in order to protect the IGBT 11 from an overcurrent. The source of the MOSFET 15 is connected to ground, and its gate is connected to an output terminal 21o of a voltage detector 21 disposed in a sense circuit 20 (to be described below). In other words, the MOSFET 15 constitutes a switching element for providing a bypass which is opened/closed depending on the set of an overcurrent in order to protect the IGBT 11 from an overcurrent. As will be described later, the N-MOSFET 15 is formed using a polysilicon semiconductor layer as an active region.

The gate drive 13 is constituted of a plurality of CMOS inverters and driver MOSFETs connected between VCCG of 12 V and ground. The gate driver 13 functions as, e.g., a NOT gate logic circuit as a whole. Similar to the shunt N-MOSFET 15, the gate driver 13 is formed using a polysilicon semiconductor layer as an active region. In normal operation, the gate driver outputs a logic signal corresponding to a gate-ON/OFF signal input from the control signal source PG. In protection operation, the gate driver 13 attains a power enough to decrease the output level of the gate driver 13 by the protection device according to the present invention. So long as the output level of the control signal source PG can be controlled, the gate driver 13 can be omitted by setting the control signal source PG in advance so as to ensure a proper power.

The sense terminal 11s of the IGBT 11 is connected to an input terminal 21i of the voltage detector 21 disposed in the sense circuit 20. To protect the voltage detector 21, a Zener diode 17 and high-resistance resistor 19 are parallel-connected between the node between the terminals 11s and 21i, and ground. The Zener diode 17 and resistor 19 are also formed using a polysilicon semiconductor layer as an active region.

The voltage detector 21 includes a resistor 23 series-connected between VCCL of 10 V and ground, as M-MOSFET 25 set to a threshold voltage corresponding to the set value of an overcurrent, and a CMOS inverter (N- and P-MOSFETs 27 and 29) connected between VCCL and ground. The node between the resistor 23 and the N-MOSFET 25 is connected to the input terminal of the CMOS inverter. The voltage detector 21 is also formed using a polysilicon semiconductor layer as an active region.

The operation of the semiconductor protection device shown in FIG. 23 will be explained.

In a normal state in which no sense terminal voltage equal to or higher than a voltage corresponding to the set value of at overcurrent is applied to the input terminal 21i of the voltage detector 21, the N-MOSFET 25 is OFF, and a node Xa is at the same potential as VCCL of 10 V. The P-MOSFET 29 is OFF, and a node Xb is ideally at a potential of 0 V. While the node Xb is at a potential of 0 V, no voltage is applied to the gate of the shunt N-MOSFET 15, and the N-MOSFET 15 is OFF. That is, an output from the gate driver 13 is not bypassed, and is directly applied to the gate of the IGBT 11.

When the IGBT 11 short-circuits and changes to an overcurrent state, the shunt N-MOSFET 15 is turned on by the following operation. For example, when a gate voltage enough to turn on the IGBT 11 is applied to the gate electrode of the IGBT 11 while a collector voltage VCE of, e.g., 300 V is applied to the collector electrode of the IGBT 11, an overcurrent starts flowing through the IGBT 11. At this time, a sense current set to a fraction of the collector current also starts flowing through the sense terminal 11s, and the voltage at the sense terminal 11s abruptly rises.

If the voltage applied from the sense terminal to the input terminal 21i of the voltage detector 21 exceeds a value corresponding to the set value of an overcurrent, i.e., the threshold voltage of the MOSFET 25, the MOSFET 25 is turned on, and the voltage at the node Xa ideally drops from VCCL to 0 V. At this time, the Zener diode 17 prevents destruction of the MOSFET 25 caused by application of an overcurrent to the gate electrode of the MOSFET 25. After the potential at the node Xa changes to 0 V, the N-MOSFET 27 is turned off, the P-MOSFET 29 is turned on, and the potential at the node Xb rises up to VCCL. VCCL is applied to the gate of the shunt N-MOSFET 15, and the MOSFET 15 is turned on. Accordingly, an output from the gate driver 13 is partially bypassed to drop the gate voltage of the IGBT 11. The current of the IGBT 11 also decreases to protect the IGBT 11 from the overcurrent state.

FIG. 24 is a timing chart showing changes in voltages at respective portions until the IGBT 11 is protected after the IGBT 11 short-circuits in the semiconductor protection device shown in FIG. 23. If a voltage VG is applied to the gate electrode of the IGBT 11 while the collector voltage VCE of the IGBT 11 is high, a collector current Ic and sense terminal voltage Vsen increase. When the sense terminal voltage Vsen input to the voltage detector 21 becomes equal to or higher than a voltage corresponding to the set value of an overcurrent potentials Va and Vb at the nodes Xa and Xb in the voltage detector 21 change to 0 V and VCCL, respectively, and a VCCL output is obtained from the voltage detector 21. Then, the shunt N-MOSFET 15 is turned on, and the gate voltage of the IGBT 11 drops to protect the IGBT 11 in the overcurrent state.

The operation of protecting the overvoltage and overcurrent states of the collector in a steady state will be explained. More specifically, as the collector voltage is applied while the voltage VG is applied to the gate electrode, the collector current starts flowing. If the collector current becomes an overcurrent, the collector voltage is detected by the MOSFET 25 to protect the IGBT 11 in the overcurrent state. FIG. 25 shows the relationship between collector voltage VCE and collector current Ic of the IGBT 11, i.e., the static current-voltage characteristic of the IGBT 11. The IGBT 11 in an overcurrent state can be protected using the MOSFET 25 having as a threshold voltage a value corresponding to the collector voltage in the overcurrent state of the IGBT 11.

FIG. 26 is a circuit diagram showing a modification of the semiconductor protection device shown in FIG. 23 together with a main semiconductor switch. As shown in FIG. 26, this modification adopts a sense circuit 20A obtained by omitting the Zener diode 17 from the sense circuit 20. The Zener diode 17 is arranged to prevent destruction of the MOSFET 25 caused by application of a voltage equal to or higher than the breakdown voltage. However, the Zener diode 17 can be omitted by, e.g., setting a current flowing through the sense terminal 11s so as not to abruptly raise the sense terminal voltage Vsen.

FIG. 27 is a circuit diagram showing a semiconductor protection device together with a main semiconductor switch according to still another embodiment of the present invention. As shown in FIG. 27, this embodiment employs a sense circuit 30 in which the voltage detector 21 shown in FIG. 23 is replaced with a voltage detector formed from a comparator 31. In the comparator 31, a reference voltage Vref corresponding to the set value of an overcurrent in an IGBT 11, and a sense terminal voltage Vsen are respectively input to first and second input terminals IN1 and IN2, and are compared with each other. If the IGBT 11 changes to an overcurrent state, and the sense terminal voltage Vsen reaches the reference voltage Vref, the potential of an output terminal 31o of the comparator 31 to turn on a shunt N-MOSFET 15. An output from a gate driver 13 is partially bypassed to drop the gate voltage of the IGBT 11. The current of the IGBT 11 also decreases to protect the IGBT 11 from the overcurrent state.

FIG. 28 is a circuit diagram showing details of the comparator 31 in the semiconductor protection device shown in FIG. 27 (or FIG. 29). As shown in FIG. 28, this comparator has substantially the same circuit arrangement as that of the comparator circuit shown in FIG. 13. The comparator 31 is formed using a polysilicon semiconductor layer common to the N-MOSFET 15 (see Fig. 27) as an active region.

More specifically, the differential amplifier of the comparator circuit comprises n-type MOSFETs N1 and N2 for receiving input signal N2 and IN1 (see FIG. 27), p-type MOSFETs P1 and P2 of a current mirror circuit, and an n-type MOSFET N3 of a current source circuit. The output stage comprises a p-type MOSFET P3 for transmitting a signal from the differential amplifier to the output terminal 31o of the comparator 31 (see FIG. 27), and an n-type MOSFET N4 of a current source circuit.

The differential amplifier further comprises n-type MOSFETs N5 and N6 respectively series-connected to the drains of the n-type MOSFETs N1 and N2 for receiving input signals. The output stage further comprises an n-type MOSFET N7 series-connected to the drain of the n-type MOSFET N4 of the current source circuit. The gates of the n-type MOSFETs N5 and N6, and that of the n-type MOSFET N7 are respectively connected to voltage bias circuits Vbias3 and Vbias4.

As described with reference to FIG. 13, the additional n-type MOSFETs N5, N6, and N7 suppress variations in voltages at points Xa, Xb, and OUT caused by poor saturation characteristics of the main n-type MOSFETs N1, N2, and N4.

With the use of devices exhibiting poor saturation characteristics, like a MOSFET using a polysilicon semiconductor layer as an active region, cascade connection makes the comparator appropriately operate. By adopting the cascade-connected comparator as the comparator 31 shown in FIG. 27 (or FIG. 29), the protection device according to this embodiment can be satisfactorily driven. For a polysilicon MOSFET, an N-MOSFET is poorer in saturation characteristics than a P-MOSFET, so only the N-MOSFET can be cascade-connected, as shown in FIG. 28. However, to improve the device function, both the N- and P-MOSFETs can be cascade-connected.

FIG. 29 is a circuit diagram showing a modification of the semiconductor protection device shown in FIG. 27 together with a main semiconductor switch. As shown in FIG. 29, this modification adopts a sense circuit 30A obtained by omitting the Zener diode 17 from the sense circuit 30. As described with reference to FIG. 26, however, the Zener diode 17 can be omitted by, e.g., setting a current flowing through the sense terminal 11s so as not to abruptly raise the sense terminal voltage Vsen.

FIG. 30 is a logic circuit diagram showing a semiconductor protection device together with a main semiconductor switch according to still another embodiment of the present invention. As shown in FIG. 30, this embodiment further comprises a latch circuit 41 arranged between a pulse generator PG serving as a control signal source and a gate driver 13 for an IGBT 11 serving as a main semiconductor switch, in addition to the arrangement shown in FIG. 23. The latch circuit 41 prevents application of a gate voltage to the IGBT 11 again by turning off a shunt N-MOSFET 15 subsequent to the IGBT 11 when the IGBT 11 is protected.

More specifically, the latch circuit 41 comprises a pair of NOR gates 43 and 45 constituting a flip-flop, a NOT gate 47 arranged between the pulse generator PG and the flip-flop, and an OR gate 49 arranged between the flip-flop and the gate driver 13. One input terminal (NOR gate 43 side) of the flip-flop is connected to an output terminal 21o (i.e., node Xb) of a voltage detector 21, and the other input terminal (NOR gate 45 side) is connected to the output terminal (corresponding to a node Xe) of the NOT gate 47. One input terminal of the OR gate 49 is connected to the output terminal (corresponding to a node Xd) of the NOR gate 45 of the flip-flop, and the other input terminal is connected to the output terminal (corresponding to the node Xe) of the NOT gate 47. The output terminal (corresponding to a point Xf) of the OR gate 49 is connected to the gate driver 13 which functions as a NOT gate.

FIG. 31 is a timing chart showing changes in voltages at respective portions in protecting the IGBT 11 in the semiconductor protection device shown in FIG. 30. If a sense terminal voltage Vsen exceeds its set value due to an overcurrent, as described above, an output Vb (point Xb) from the voltage detector 21 changes to 1. In accordance with the rise of the output Vb, the latch circuit 41 ignores an ON signal (Vin=1) from the control signal source PG, and latches an output Vf (point Xf) from the latch circuit 41 to be 1, i.e., an output from the gate driver 13 to be 0. Then, the gate voltage VG of the IGBT 11 changes to the OFF state. When the signal from the control signal source PG is switched to the OFF signal (Vin=0) upon the fall of one pulse from the control signal source PG, an output Ve (point Xe) from the NOT gate 47 rises to reset the latch circuit 41. However, the output Vf (point Xf) from the latch circuit 41, i.e., the output from the gate driver 13 is kept latched, and therefore the gate voltage VG of the IGBT 11 remains OFF. In other words, once the IGBT 11 is protected, the protection is not canceled as far as a signal from the pulse generator PG is switched from the ON state of the OFF state, which prevents abnormal oscillation.

FIG. 32 is a circuit diagram showing a semiconductor protection circuit together with a main semiconductor switch according to still another embodiment of the present invention. As shown in FIG. 32, an accessory control electrode 11sg dedicated to a sense terminal 11s is accessorily added to an IGBT 11, and is connected to a control signal source PG independently of the gate electrode of the IGBT 11. An accessory gate driver 14 is arranged between the control signal source PG and the control electrode 11sg. A shunt N-MOSFET 15 is connected to only the gate electrode side of the IGBT 11, and is not connected to the accessory control electrode 11sg.

In this embodiment, if the IGBT 11 is protected, the shunt N-MOSFET 15 is turned on to slightly decrease the gate voltage of the IGBT 11 or change it to an OFF voltage. However, an ON voltage is kept applied to the accessory control electrode 11sg, so that the MOSFET 15 remains ON. Hence, similar to the semiconductor protection device shown in FIG. 30, this arrangement can prevent application of a gate voltage to the IGBT 11 again by turning off the shunt N-MOSFET 15 subsequent to the IGBT 11 when the IGBT 11 is protected.

FIG. 33 is a sectional view showing a structure in which the IGBT 11 serving as a main semiconductor switch, the shunt N-MOSFET 15, and a resistor 19 are integrated on the same substrate. This sectional structure corresponds to the circuit shown in FIG. 23 though the gate driver 13 and sense circuit 20 are not illustrated for illustrative convenience.

As shown in FIG. 33, a $p^+$-type collector layer 55 for the IGBT 11 is formed on the lower surface of an $n^-$-type substrate layer 51 of single-crystalline silicon via an n-type buffer layer 53. A p-type main well layer 61 and p-type sub-well layer 63 are formed in the upper surface of the substrate layer 51. An $n^+$-type emitter layer 65 and $p^+$-type contact layer 67 for the IGBT 11 are formed in the surface of the main well layer 61. AN $n^+$-type sense emitter layer 69 and $p^+$-type contact layer 71 for the sense terminal are formed in the surface of the sub-well layer 63. That is, the IGBT 11 is formed using the single-crystalline silicon substrate layer 51 as an active region.

A collector electrode 57 is formed on the collector layer 55. An emitter electrode 73 is formed on the emitter layer 65 an contact layer 67. A sense electrode 75 is formed on the sense emitter layer 69 and $p^+$-type contact layer 71. Gate electrodes 77 for the IGBT 11 are formed in the regions of the well layers 61 and 63 sandwiched between the substrate layer 51 and the emitter layers 65 and 69. These gate electrodes 77 are connected to the control signal source PG.

First and second polysilicon semiconductor layers 81a and 81b are formed adjacent to the formation region of the IGBT 11 on the substrate layer 51 via an insulating film 83. An $n^+$-type source layer 85, $n^+$-type drain layer 87, and p-type channel region 89 for the shunt N-MOSFET 15 are formed in the first semiconductor layer 81a. The second semiconductor layer 81b is formed as a $p^+$-type layer as a whole, and functions as the resistor 19, That is, the N-MOSFET 15 and resistor 19 are formed using the polysilicon semiconductor layer as an active region.

Source and drain electrodes 91 and 93 are respectively formed on the source and drain layers 85 and 87. The drain electrode 93 is connected to the node between the control signal source PG and the gate electrode of the IGBT 11. A gate electrode 95 is formed on the channel region 89 via an insulating film 94, and connected to the sense electrode 75. Electrodes 97 and 99 are formed at the two ends of the second semiconductor layer 81b, and respectively connected to the gate electrode 95 of the N-MOSFET 15 and grand.

By the same method as the N-MOSFET 15, the gate driver 13, Zener diode 17, voltage detector 21, comparator 31, and the like can be formed by forming a polysilicon semiconductor layer via an insulating film on a single-crystalline substrate layer on which the IGBT 11 is formed, and using this semicondcutor layer as an active region.

The embodiments described with reference to FIGS. 23 to 33 can provide a semiconductor protection device for suppressing a current flowing through the main semiconductor switch to a set value or less by connecting a sense terminal branched from a main semiconductor switch, via a sense circuit to the control electrode of a switching element which uses, e.g., a polysilicon semiconductor layer as an active region. Especially, these embodiments can provide a low-cost integrated circuit by forming a main semiconductor switch using a single-crystalline semiconductor substrate layer as an active region, and forming a semiconductor protection device using as an active region a polysilicon semiconductor layer formed on the substrate layer via an insulating film.

In the embodiments described with reference to FIGS. 23 to 33, the main semiconductor switch is not limited to an IGBT, and may be a switch having another gate structure, e.g., a MOSFET or GTO (Gate Turn-Off Thyristor). The insulating film of the MOS structure is not limited to an oxide film, and a so-called MIS structure can be used.

Additional advantages and modifications will readily occur to those skilled in the art. Therefore, the invention in its broader aspects is not limited to the specific details and representative embodiments shown and described herein. Accordingly, various modifications may be made without departing from the spirit of the general inventive concept as defined by the appended claims and their equivalents.

What is claimed is:

1. A semiconductor device circuit comprising:

a first MISFET of an n-type which is connected between a node of a signal transmission line and a low-potential source and uses a poly-crystalline silicon layer as an active region, the first MISFET having a poor saturation characteristic, due to use of the poly-crystalline silicon and the n-type, in which an increase in drain current does not saturate with an increase in drain voltage within an operating range;

a second MISFET of the n-type which is connected between the node and the first MISFET and uses a poly-crystalline silicon layer as an active region, the second MISFET having a poor saturation characteristic, due to use of poly-crystalline silicon and the n-type, in which an increase in drain current does not saturate with an increase in drain voltage within an operating range, and the second MISFET being configured to suppress variations in voltage at the node caused by poor saturation characteristic of the first MISFET; and a first bias circuit portion configured to apply a *first* bias voltage to a gate of the second MISFET, wherein a combination of the first and second MISFETs and the first bias circuit portion is arranged to function as an alternative to one MISFET of the n-type using a single-crystalline silicon layer as an active region*; and*

*wherein the poly-crystalline silicon layers are disposed, through an insulating film, on a single-crystalline semiconductor layer in which a main semiconductor switch is formed.*

2. A circuit according to claim 1, further comprising:

a third MISFET of the n-type which is connected to the low-potential source in parallel with the [second] *first* MISFET and uses a poly-crystalline silicon layer as an active region, the third MISFET having a poor saturation characteristic, due to use of the poly-crystalline silicon and the n-type, in which an increase in drain current does not saturate with an increase in drain voltage within an operating range;

a fourth MISFET of the n-type which is series-connected to a drain of the third MISFET and uses a poly-crystalline silicon layer as an active region, the fourth MISFET having a poor saturation characteristic, due to use of the poly crystalline silicon and the n-type, in which an increase in drain current does not saturate with an increase in drain voltage within an operating range, and the fourth MISFET being configured to suppress variations in voltage at the node caused by the poor saturation characteristic of the third MISFET;

a second bias current portion configured to apply [a] *said first* bias voltage to a gate of the fourth MISFET; and first and second input circuit portions configured to input differential signals to gates of the first and third MISFETs, respectively, wherein a combination of the third and fourth MISFETs and the second bias circuit portion is arranged to function as an alternative to one MISFET of the n-type using a single-crystalline silicon layer as an active region.

3. A circuit according to claim 2, wherein the first to fourth MISFETs, the first and second bias current portions, and the first and second input circuit portions are part of a differential amplifier.

4. A circuit according to claim 2, further comprising:

a fifth MISFET of the n-type which is connected between an output terminal and [a] *the* low-potential source and uses a poly-crystalline silicon layer as an active region, the fifth MISFET having a poor saturation characteristic, due to use of the poly-crystalline silicon and the n-type, in which an increase in drain current does not saturate with an increase in drain voltage within an operating range;

a sixth MISFET of the n-type which is connected between the output terminal and the fifth MISFET and uses a poly-crystalline silicon layer as an active region, the sixth MISFET having a poor saturation characteristic, due to use of the poly-crystalline silicon and the n-type, in which an increase in drain current does not saturate with an increase in drain voltage within an operating range, and the sixth MISFET being configured to suppress variations in voltage at the node caused by the poor saturation characteristic of the fifth MISFET;

a third bias circuit portion configured to apply a bias voltage to a gate of the fifth MISFET; and a fourth bias current portion configured to apply a bias voltage to a gate of the sixth MISFET, wherein a combination of the fifth and sixth MISFETs and the fourth bias circuit portion is arranged to function as an alternative to one MISFET of the n-type using a single-crystalline silicon layer as an active region.

5. A circuit according to claim 4, wherein the fifth and sixth MISFETs and the third and fourth bias circuit portions are part of a current source circuit.

6. A circuit according to claim 4, wherein the first to fourth MISFETs, the first and second bias circuit portions, and the first and second input circuit portions are part of a differential amplifier, the fifth and sixth MISFETs and the third and fourth bias circuit portions are of a current source circuit, and the differential amplifier and the current source circuit are part of a comparator.

[7. A circuit according to claim 1, wherein the poly-crystalline silicon layers are disposed, through an insulating film, on a single-crystalline semiconductor layer in which a main semiconductor switch is formed.]

8. A circuit according to claim [7] *1*, wherein the circuit is part of a semiconductor protection device configured to protect the main semiconductor switch.

9. A circuit, comprising:

a differential amplifier connected to an output stage, wherein each of said differential amplifier and said output stage comprises:

a first n-type MISFET connected in series with a second n-type MISFET, each of said first and second MISFETs having a poly-crystalline silicon layer as an active region; and a bias circuit portion configured to apply a bias voltage to a gate of each of the first MISFETs,

*a current capability of said first MISFET of said output stage being greater than a current capability of said second MISFET of said output stage.*

10. A circuit according to claim 9, comprising:

said first MISFET connected directly in series with said second MISFET.

11. A circuit according to claim 9, comprising:

said first MISFET and said second MISFET of said differential amplifier being connected between a first node and a low level potential source, said first MISFET of said differential amplifier being configured to suppress voltage variations at said first node; and said first MISFET and said second MISFET of said output stage being connected together at a second node, said first MISFET of said output stage being configured to suppress voltage variations at said second node.

[12. A circuit according to claim 11, comprising:

a current capability of said first MISFET of said output stage being greater than a current capability of said second MISFET of said output stage.]

[13. A circuit according to claim 9, comprising:

a current capability of said first MISFET of said output stage being greater than a current capability of said second MISFET of said output stage.]

14. A circuit according to claim 9, comprising:

said first MISFET series-connected to a drain of said second MISFET.

15. The circuit according to claim 1, further comprising a circuit portion configured to apply a bias voltage to a gate of the first MISFET, wherein the circuit constitutes a current source circuit.

16. The circuit according to claim 1, further comprising:

a third n-type MISFET which is connected to the low-potential source in parallel with the first MISFET and uses a semiconductor layer as an active region;

a fourth n-type MISFET which is series-connected to a drain of the third MISFET and uses a semiconductor layer as an active region;

a *first* circuit portion configured to connect a gate of the first MISFET to a gate and the drain of the third MISFET; and a *second* circuit portion configured to apply a bias voltage to a gate of the fourth MISFET, wherein the circuit constitutes a current mirror circuit of a differential amplifier.

17. The circuit according to claim 1, further comprising:

a third p-type MISFET which is connected between the node and a high-potential source and uses a semiconductor layer as an active region; and an input circuit portion configured to input a logic signal to gates of the first and third MISFETs, wherein the circuit constitutes a CMOS logic gate circuit arranged such that a logic signal is output from the node.

18. The circuit according to claim 17 wherein the third MISFET has a poor saturation characteristic in which an increase in drain current does not saturate with an increase in drain voltage within an operating range, the circuit further comprising:

a fourth p-type MISFET which is connected between the node and the third MISFET and uses a semiconductor layer as an active region, the fourth MISFET being configured to suppress variations in voltage at the node caused by the poor saturation characteristic of the third MISFET; and a circuit portion configured to apply a bias voltage to a gate of the fourth MISFET.

19. The circuit according to claim 1, further comprising:

a p-type main MISFET which is connected between the node and a high-potential source and uses a semiconductor layer as an active region, the main MISFET having a poor saturation characteristic in which an increase in drain current does not saturate with an increase in drain voltage within an operating range;

a p-type sub-MISFET which is connected between the node and the main MISFET and uses a semiconductor layer as an active region, the sub-MISFET being configured to suppress variations in voltage at the node caused by the poor saturation characteristic of the main MISFET; and a circuit portion configured to apply a bias voltage to a gate of the sub-MISFET.

*20. A semiconductor device circuit comprising:*

*a switching device having a control terminal and connected between an input terminal of a main switching device and a low-potential source;*

*a first MISFET of an n-type which is connected between a first node connected to said control terminal and a low-potential source and uses a poly-crystalline silicon layer as an active region;*

*a second MISFET of the n-type which is connected between the first node and the first MISFET and uses a poly-crystalline silicon layer as an active region; and*

*a first bias circuit portion configured to apply a bias voltage to a gate of the second MISFET; and*

*said second MISFET having a greater current capability than said first MISFET.*

*21. The device according to claim 20, comprising:*

*each of said first and second MISFETs having a poor saturation characteristic; and*

*said second MISFET being configured to suppress variations in voltage at the node caused by the poor saturation characteristic of the first MISFET.*

*22. The device according to claim 20, comprising:*

*said first MISFET and said second MISFET being connected together at a second node;*

*said second MISFET being configured to suppress variations in voltage at said second node.*

*23. The device according to claim 20, comprising:*

*said main switching device being formed in a single crystal silicon material; and*

*said poly-crystalline silicon layers of said first and second MISFETs being disposed on said single crystal silicon layer with an insulating film being disposed between said poly-crystalline layers and said single crystal silicon material.*

*24. A semiconductor device circuit comprising:*

*a switching device having a control terminal and connected between an input terminal of a main switching device and a low-potential source;*

*a sense circuit having an output connected to said control terminal, said sense circuit comprising:*

*a first MISFET of an n-type which is connected between a node and a low-potential source and uses a poly-crystalline silicon layer as an active region;*

*a second MISFET of the n-type which is connected between the node and the first MISFET and uses a poly-crystalline silicon layer as an active region; and*

*a first bias circuit portion configured to apply a bias voltage to a gate of the second MISFET,*

*said second MISFET having a greater current capability than said first MISFET.*

*25. The device according to claim 24, wherein a combination of the first and second MISFETs and the first bias circuit portion is arranged to function as an alternative to one MISFET of the n-type using a single-crystalline silicon layer as an active region.*

*26. The device according to claim 24, further comprising:*

*a third MISFET of the n-type which is connected to the low-potential source in parallel with the first MISFET and uses a poly-crystalline silicon layer as an active region;*

*a fourth MISFET of the n-type which is series-connected to a drain of the third MISFET and uses a poly-crystalline silicon layer as an active region; and*

*a second bias circuit portion configured to apply a bias voltage to a gate of the fourth MISFET; and*

*first and second input circuit portions configured to input differential signals to gates of the first and third MISFETs, respectively.*

*27. The device according to claim 26, wherein a combination of the third and fourth MISFETs and the second bias circuit portion is arranged to function as an alternative to one MISFET of the n-type using a single-crystalline silicon layer as an active region.*

*28. The device according to claim 26, wherein the fourth MISFET is configured to suppress variations in voltage at the node caused by the poor saturation characteristic of the third MISFET.*

*29. The device according to claim 26, wherein the first to fourth MISFETs, the first and second bias circuit portions, and the first and second input circuit portions are part of a differential amplifier.*

*30. The device according to claim 26, further comprising:*

*a fifth MISFET of the n-type which is connected between an output terminal and the low-potential source and uses a poly-crystalline silicon layer as an active region;*

*a sixth MISFET of the n-type which is connected between the output terminal and the fifth MISFET and uses a poly-crystalline silicon layer as an active region*

*a third bias circuit portion configured to apply a bias voltage to a gate of the fifth MISFET; and*

*a fourth bias current portion configured to apply a bias voltage to a gate of the sixth MISFET.*

*31. The device according to claim 30, wherein the sixth MISFET is configured to suppress variations in voltage at a node between said fifth and sixth MISFETs caused by poor saturation characteristic of the fifth MISFET.*

*32. The device according to claim 30, wherein a combination of the fifth and sixth MISFETs and the fourth bias circuit portion is arranged to function as an alternative to one MISFET of the n-type using a single-crystalline silicon layer as an active region.*

*33. The device according to claim 24, wherein the fifth and sixth MISFETs and the third and fourth bias circuit portions are part of a current source circuit.*

*34. The device according to claim 24, wherein the first and second MISFETs and the first bias circuit portion are part of a current source circuit.*

*35. The device according to claim 24, wherein:*

*said main switching device being formed in a single crystal silicon material; and*

*said poly-crystalline silicon layers of said first and second MISFETs being disposed on said single crystal silicon layer with an insulating film being disposed between said poly-crystalline layers and said single crystal silicon material.*

*36. The device according to claim 24, comprising:*

*said main switching device having a sense terminal; and*

*said sense circuit being connected between said sense terminal and said control terminal.*

*37. The device according to claim 24, comprising:*

*said sense circuit being configured to control said control terminal based upon a sense current flowing into said sense circuit exceeding a predetermined value.*

*38. The device according to claim 24, comprising:*

*said sense circuit being configured to control said control terminal based upon a sense current flowing into said sense circuit to decrease a voltage applied to a main control electrode of said main switching device.*

*39. The device according to claim 38, comprising:*

*said sense circuit being configured to control said control terminal based upon a sense current flowing into said sense circuit exceeding a predetermined value.*

*40. A semiconductor device circuit comprising:*

*a switching device having a control terminal and connected between an input terminal of a main switching device and a low-potential source;*

*a first MISFET of an n-type which is connected between a first node connected to said control terminal and a low-potential source and uses a poly-crystalline silicon layer as an active region;*

*a second MISFET of the n-type which is connected between the first node and the first MISFET and uses a poly-crystalline silicon layer as an active region; and*

*a first bias circuit portion configured to apply a bias voltage to a gate of the second MISFET,*

*said main switching device being formed in a single crystal silicon material; and*

*said poly-crystalline silicon layers of said first and second MISFETs being diposed on said single crystal silicon layer with an insulating film being disposed between said poly-crystalline layers and said single crystal silicon material.*

*41. A semiconductor device circuit comprising:*

*a switching device having a control terminal and connected between an input terminal of a main switching device and a low-potential source;*

*a sense circuit having an output connected to said control terminal, said sense circuit comprising:*

*a first MISFET of an n-type which is connected between a node and a low-potential source and uses a poly-crystalline silicon layer as an active region;*

*a second MISFET of the n-type which is connected between the node and the first MISFET and uses a poly-crystalline silicon layer as an active region; and*

*a first bias circuit portion configured to apply a bias voltage to a gate of the second MISFET,*

*said main switching device being formed in a single crystal silicon material; and*

*said poly-crystalline silicon layers of said first and second MISFETs being disposed on said single crystal silicon layer with an insulating film being disposed between said poly-crystalline layers and said single crystal silicon material.*

* * * * *